United States Patent [19]
Satoh

[11] Patent Number: 5,428,227
[45] Date of Patent: Jun. 27, 1995

[54] SEMICONDUCTOR LIGHT EMITTING ELEMENT

[75] Inventor: Shiro Satoh, Ogawara, Japan

[73] Assignees: Ricoh Company, Ltd., Tokyo; Ricoh Research Institute of General Electronics Co., Ltd., Natori, both of Japan

[21] Appl. No.: 213,575

[22] Filed: Mar. 16, 1994

[30] Foreign Application Priority Data

Mar. 17, 1993 [JP] Japan .................................. 5-057450
Oct. 15, 1993 [JP] Japan .................................. 5-258502

[51] Int. Cl.⁶ ...................... H01L 29/41; H01L 33/00; H01S 3/19
[52] U.S. Cl. ........................................ 257/95; 257/98; 257/101; 372/44; 372/50; 372/98
[58] Field of Search .............. 257/98, 95, 101; 372/98, 44, 50

[56] References Cited

U.S. PATENT DOCUMENTS

| | | | |
|---|---|---|---|
| 4,815,084 | 3/1989 | Scifres | 257/98 |
| 5,117,477 | 5/1992 | Satoh | 257/21 |
| 5,200,605 | 4/1993 | Satoh et al. | 250/214 LS |
| 5,264,849 | 11/1993 | Kondoh | 341/137 |

FOREIGN PATENT DOCUMENTS

| | | | |
|---|---|---|---|
| 0384849 | 8/1990 | European Pat. Off. | 257/98 |
| 63-132487 | 6/1988 | Japan | 257/98 |
| 2-52455 | 2/1990 | Japan . | |
| 3179787 | 8/1991 | Japan | 257/98 |

OTHER PUBLICATIONS

"O plus E", Mar., 1991, pp. 112–117.

Primary Examiner—Jerome Jackson
Attorney, Agent, or Firm—Oblon, Spivak, McClelland, Maier & Neustadt

[57] ABSTRACT

A semiconductor light emitting element has a semiconductor laminating structure formed on a semiconductor substrate and having a junction portion formed in parallel with a semiconductor substrate face; a light generating portion formed in the vicinity of the junction portion such that an electric current can be injected into the light generating portion; a light emitting end face approximately perpendicular to the junction portion and approximately having an arc or hyperbolic shape in a direction parallel to the semiconductor substrate face; and an electrode for electric current injection formed in an upper portion of the semiconductor laminating structure and arranged in a position separated from at least a center of curvature of the arc light emitting end face. The semiconductor light emitting element has a shape of the light emitting portion and a layer structure capable of controlling a radiant angle of light. Since the light emitting end face is formed in an arc shape, a full angle at half maximum of emitted light in a horizontal direction with respect to the substrate face can be reduced in comparison with a case in which the light emitting end face has a linear shape. Optical coupling efficiency with respect to an optical fiber and a lens system can be improved.

37 Claims, 11 Drawing Sheets

ALUMINUM COMPOSITION

REFRACTIVE INDEX n

SEMICONDUCTOR LIGHT EMITTING ELEMENT

BACKGROUND OF THE INVENTION

1. Field of the Invention

The present invention relates to a semiconductor light emitting element (LED) which is applied to a light source for solid optical writing used in a digital copying machine, a facsimile telegraph, an optical printer, etc., and is also applied to a light source for optical fibers, etc. in optical communication, optical information processing, etc. More particularly, the present invention relates to a semiconductor light emitting element of an end face light emitting type in which the shape of a light emitting portion and a layer structure are improved to control a radiant angle of light.

2. Description of the Related Art

A semiconductor light emitting element of an end face light emitting type is developed. This semiconductor light emitting element of an end face light emitting type is called an end face type LED in the following description. This semiconductor light emitting element has a laminating structure formed on a semiconductor substrate. Light is emitted from an end face approximately perpendicular to a junction portion. The semiconductor light emitting element of an end face light emitting type is applied to a light source for solid optical writing used in a digital copying machine, a facsimile telegraph, an optical printer, etc., and is also applied to a light source for optical fibers, etc. in optical communication, optical information processing, etc.

Light emitted from this end face LED approximately has a radiant angle having a half-value angle of about 120° in accordance with a Lambert's distribution in a direction parallel to a substrate face. Therefore, for example, the end tip of an optical fiber is formed in a spherical shape or light is guided into the optical fiber through a lens so as to couple light of the end face type LED to the optical fiber at a low loss. However, there is a limit in improvement of optical coupling efficiency. When the emitted light is used through a lens system and its utilization efficiency is improved, it is necessary to increase a numerical aperture (NA) of the lens. Accordingly, there are many problems associated with the design of the lens.

In particular, in the case of the end face type LED, an entire radiant angle of light in a direction perpendicular to the substrate face can be easily set to be equal to or smaller than 25° by optimizing a layer structure. Accordingly, it is necessary to reduce the radiant angle of light parallel to the substrate face so as to improve the optical coupling efficiency with respect to the optical fiber and the lens. In contrast to this, in the case of a semiconductor laser, the entire radiant angle of light perpendicular to a substrate face is larger than that parallel to the substrate face so that the relation between these radiant angles is opposite to that in the case of the end face type LED. Therefore, light perpendicular to the substrate face is diaphragmed as an effective means for improving the optical coupling efficiency with respect to the optical fiber and the lens.

In any case, it is necessary to position the light emitting element with respect to an optical element such as a lens with high accuracy when the light emitting element and the optical element are in hybrid combination with each other. Accordingly, reproducibility and yield are reduced and an expensive jig, etc. are required.

A method for monolithically forming a light emitting element of an end face light emitting type and a lens on the same semiconductor substrate is proposed as a method for omitting a positioning operation Of the light emitting element and the lens. For example, this method is shown in a semiconductor laser of a microlens integrated type (see FIG. 9) described in reference "O plus E, page 112, March, 1991". In this semiconductor laser, a lens composed of a quartz material is formed on the same GaAs substrate in front of a light emitting end face of the light emitting element of the end face light emitting type.

This lens is formed as follows. Namely, a semiconductor laminating structure is formed on a semiconductor substrate 1 and includes an active layer 2 for generating light. In this semiconductor laminating structure, an end face for emitting light is formed such that the active layer is exposed in a direction perpendicular to the substrate face. Further, a silicon oxide film, a nitride film, etc. are laminated and formed on the semiconductor substrate in front of this end face. Further, the laminating structure is dry-etched in a lens shape so that a light emitting device monolithically formed by a light emitting element 4 and a lens is completely manufactured.

However, in this case, another material process is newly required after the completion of a semiconductor process for forming the light emitting element. Accordingly, the number of manufacturing processes is increased and the manufacturing processes are complicated. Therefore, there are problems about yield, reproducibility, uniformity in semiconductor array, etc.

SUMMARY OF THE INVENTION

It is therefore an object of the present invention to provide a novel semiconductor light emitting element for solving problems in manufacture of a light emitting device used by combining a light emitting element and a lens system with each other such that an entire radiant angle of light emitted in a direction parallel to a face of the substrate of an end face type LED is reduced to improve optical coupling efficiency with respect to an optical fiber and a lens.

Another object of the present invention is to provide a novel semiconductor light emitting element easily manufactured such that light perpendicular to the substrate face can be also diaphragmed when it is necessary to increase the optical coupling efficiency.

Another object of the present invention is to provide a novel semiconductor light emitting element for solving problems caused when a light emitting element and a lens system are in hybrid combination with each other. Namely, this object of the present invention is to provide a semiconductor light emitting element in which it is not necessary to position the light emitting element and the lens system with high accuracy, and problems about low reproducibility and yield and requirement of an expensive jig, etc. are solved. Further, this object of the present invention is to provide a semiconductor light emitting element for solving problems that the number of manufacturing processes is increased and the manufacturing processes are complicated in a monolithic case using a combination of other different material systems.

In accordance with a first construction of the present invention, the above objects can be achieved by a semiconductor light emitting element comprising a semiconductor laminating structure formed on a semiconsubstrate and having a junction portion formed in parallel with a semiconductor substrate face; a light generating portion formed in the vicinity of the junction portion such that an electric current can be injected to the light generating portion; a light emitting end face approximately perpendicular to the junction portion and approximately having an arc shape in a direction parallel to the semiconductor substrate face; and an electrode for electric current injection formed in an upper portion of the semiconductor laminating structure and arranged in a position separated from at least a center of curvature of the arc light emitting end face.

In accordance with a thirteenth construction of the present invention, the above objects can be also achieved by a semiconductor light emitting element comprising a semiconductor laminating structure formed on a semiconductor substrate and having a junction portion formed in parallel with a semiconductor substrate face; the semiconductor laminating structure being constructed by a double hetero structure in which an active layer for generating light is supported between upper and lower clad layers each having a forbidden band width wider than that of the active layer and having a refractive index smaller than that of the active layer; the semiconductor laminating structure being constructed such that an electric current can be injected to the active layer; and a light emitting end face approximately perpendicular to the substrate face; the semiconductor light emitting element being constructed such that the refractive index of each of the upper and lower clad layers supporting the active layer therebetween is reduced as each of the upper and lower clad layers is separated from the active layer.

In the above constructions of the present invention, it is possible to solve problems in manufacture of a light emitting device used by combining a light emitting element and a lens system with each other such that an entire radiant angle of light emitted in a direction parallel to a face of the substrate of an end face type LED is reduced to improve optical coupling efficiency with respect to an optical fiber and a lens.

Further, the semiconductor light emitting element can be easily manufactured such that light perpendicular to the substrate face can be also diaphragmed when it is necessary to increase the optical coupling efficiency.

Further, it is possible to solve problems caused when a light emitting element and a lens system are in hybrid combination with each other. Namely, it is not necessary to position the light emitting element and the lens system with high accuracy, and problems about low reproducibility and yield and requirement of an expensive jig, etc. are solved. Further, it is possible to solve problems that the number of manufacturing processes is increased and the manufacturing processes are complicated in a monolithic case using a combination of other different material systems.

Further objects and advantages of the present invention will be apparent from the following description of the preferred embodiments of the present invention as illustrated in the accompanying drawings.

BRIEF DESCRIPTION OF THE DRAWINGS

FIG. 1b is a plan view of the semiconductor light emitting element shown in FIG. 1a;

FIG. 1c is a cross-sectional view taken along line C-C' of the semiconductor light emitting element shown in FIG. 1a;

FIG. 4b is a cross-sectional view taken along line C-C' of the semiconductor light emitting element shown in FIG. 4a;

FIG. 4c is a cross-sectional view taken along line E-E' of the semiconductor light emitting element shown in FIG. 4a;

FIGS. 7a and 7b are views showing data at a full angle at half maximum of optical outputs of a general semiconductor light emitting element of an end face light emitting type and the semiconductor light emitting element in the first embodiment of the present invention in which:

FIG. 7a shows a general case in which a light emitting end face is planar; and

FIG. 7b shows a case of the present invention in which a light emitting end face is formed in an arc shape;

FIG. 12b is a cross-sectional view taken along line C-C' of the semiconductor light emitting element shown in FIG. 12a;

FIGS. 13b and 13c each are a view showing an aluminum composition and a refractive index distribution on a sectional line D-D' of the semiconductor light emitting element shown in FIG. 13a;

FIGS. 14b and 14c each are a view showing an aluminum composition and a refractive index distribution on a sectional line D-D' of the semiconductor light emitting element shown in FIG. 14a.

DESCRIPTION OF THE PREFERRED EMBODIMENTS

Figure 1A:
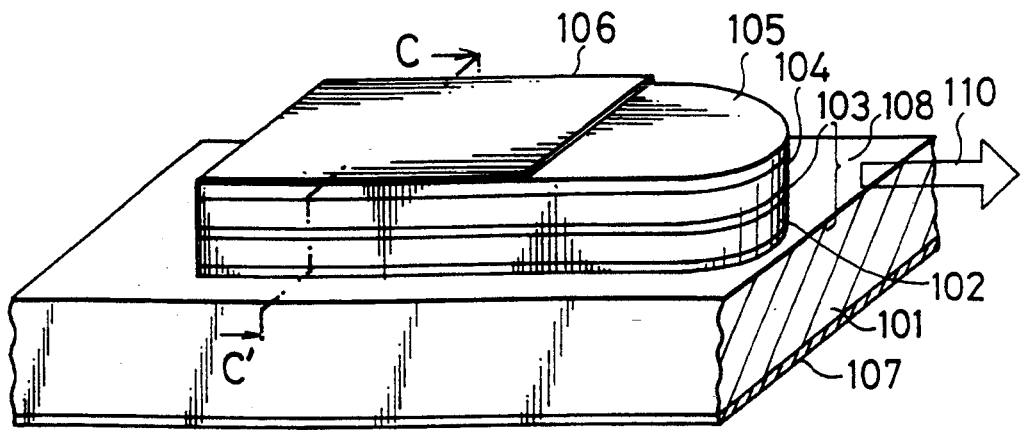
FIG. 1a is a perspective view of a semiconductor light emitting element in accordance with a first embodiment of the present invention.

The preferred embodiments of a semiconductor light emitting element in the present invention will next be described in detail with reference to the accompanying drawings.

In a first construction of the present invention, a semiconductor light emitting element comprises a semiconductor laminating structure formed on a semiconductor substrate and having a junction portion formed in parallel with a semiconductor substrate face; a light generating portion formed in the vicinity of the junction portion such that an electric current can be injected to the light generating portion; a light emitting end face approximately perpendicular to the junction portion and approximately having an arc shape in a direction parallel to the semiconductor substrate face; and an electrode for electric current injection formed in an upper portion of the semiconductor laminating structure and arranged in a position separated from at least a center of curvature of the arc light emitting end face.

In a second construction of the present invention, the electrode for electric current injection formed in the upper portion of the semiconductor laminating structure is arranged in a position separated by at least 3 μm from the center of curvature of the arc light emitting end face.

In a third construction of the present invention, the electrode for electric current injection formed in the upper portion of the semiconductor laminating structure is arranged in a position separated from at least the center of curvature of the arc light emitting end face. A groove is formed from the upper portion of the semiconductor laminating structure between the light emitting end face and the electrode for electric current injection until a depth which does not reach the light generating portion in the vicinity of the junction portion.

In a fourth construction of the present invention, a height of the semiconductor laminating structure having the electrode for electric current injection in its upper portion is different from the height of a semiconductor laminating structure having no electrode for electric current injection between the electrode and the forward light emitting end face. Light generated within the semiconductor laminating structure having the electrode for electric current injection can pass through a layer of the semiconductor laminating structure having no electrode for electric current injection and having a forbidden band width wider than that of a semiconductor layer generating the light.

In a fifth construction of the present invention, the semiconductor laminating structure having the electrode for electric current injection in its upper portion is equal to the semiconductor laminating structure having no electrode for electric current injection between the electrode and the forward light emitting end face. The height of a semiconductor substrate portion laminated with the semiconductor laminating structure having the electrode for electric current injection in its upper portion is different from the height of a semiconductor substrate portion laminated with the semiconductor laminating structure having no electrode for electric current injection between the electrode and the forward light emitting end face so that a step difference is formed between these semiconductor substrate portions.

In a sixth construction of the present invention, a width of the semiconductor laminating structure having no electrode for electric current injection between the electrode and the forward light emitting end face in a direction perpendicular to a light emitting direction is wider than a width of the semiconductor laminating structure having the electrode for electric current injection in its upper portion in the direction perpendicular to the light emitting direction.

In a semiconductor light emitting element based on each of seventh to eleventh constructions of the present invention, the light emitting end face is formed in a hyperbolic shape to reduce spherical aberration in comparison with the arc shape in each of the first to sixth constructions.

The above constructions are provided to reduce an entire radiant angle of light emitted in a direction parallel to a substrate face.

In a semiconductor light emitting element based on each of thirteenth to nineteenth constructions of the present invention, it is possible to diaphragm light emitted in a direction perpendicular to a substrate face. Namely, a refractive index distribution is formed in the direction perpendicular to the substrate face within upper and lower layers formed above and below a layer for generating light. Light having a wider forbidden band width can be transmitted through each of the upper and lower layers. Thus, the upper and lower layers function as a lens.

The fourteenth and fifteenth constructions relate to how to form the refractive index distribution.

The sixteenth construction relates to a structure for separately arranging a portion for generating light and a portion functioning as a lens. No light is generated from the lens functional portion. A focal point position can be controlled by changing the length of a light passing portion in the lens functional portion so that a diaphragming amount of light can be changed. A light emitting output of the semiconductor light emitting element is influenced by its length. Accordingly, it is necessary to independently control the operations of an optical output section and a lens functional section. The operations of the optical output section and the lens functional section can be independently controlled by the present invention.

In each of the seventeenth and eighteenth constructions, when there is the same layer as a layer for generating light in a light passing region of a lens functional portion having no electrode for electric current injection in its upper portion and functioning as only a lens, this layer acts as a light absorption layer so that light taken out of the light emitting end face is greatly lost. Therefore, it is necessary to take measures for reducing absorption of light passing through the light passing region. In such measures, a height of the same layer as the light generating layer is located above or below the light generating layer. Further, a height of each of upper and lower clad layers having a wider forbidden band width and arranged above and below the light generating layer is set to be in conformity with a height of the light generating layer.

In the nineteenth construction, a refractive index of each of the clad layers is set to be highest in a position providing a height of each of the clad layers in conformity with that of the light generating layer. This refractive index is set within each of the clad layers in the light passing region of the lens functional portion functioning as only a lens. Thus, the semiconductor light emitting element of the nineteenth construction functions as a lens for reducing a light loss caused by light absorption.

In twentieth to twenty-third constructions, an entire radiant angle of light emitted in a direction parallel to a substrate face can reduced and light in a direction perpendicular to the substrate face can be diaphragmed in the semiconductor light emitting element having each of the first, fourth, seventh and tenth constructions. Thus, it is possible to improve optical coupling efficiency with respect to an optical fiber and a lens. The light emitted in the direction parallel to the substrate face can be diaphragmed by forming the light emitting end face in an arc or hyperbolic lens shape, etc. The light emitted in the direction perpendicular to the substrate face can be diaphragmed by forming a refractive index distribution in a semiconductor layer for passing this light therethrough.

A construction and an operation of the semiconductor light emitting element in the present invention will next be explained in detail.

A semiconductor laminating structure is formed in the semiconductor light emitting element of the present invention. The semiconductor laminating structure includes at least a semiconductor clad layer of a first conductivity type, a semiconductor active layer as a light generating portion, a semiconductor clad layer of a second conductivity type, a semiconductor electrode layer of the second conductivity type having a relatively low resistance from below to above on a semiconductor substrate of the first conductivity type. At least three sides (such as front, right-hand and left-hand sides) of front and rear and right-hand and left-hand sides of the semiconductor laminating structure are formed as faces approximately perpendicular to a semiconductor substrate face. The front side face of the semiconductor laminating structure is set to a light emitting end face and approximately has a convex arc shape in a direction parallel to the substrate face. An electrode metallic layer of the second conductivity type for electric current injection is formed on the semiconductor laminating structure in a position separated from a center of curvature of this arc such that this electrode metallic layer comes in contact with the semiconductor laminating structure. In the first construction, no electrode metallic layer of the second conductivity type for electric current injection comes in contact with the semiconductor laminating structure between the approximately convex arc end face and the electrode metallic layer of the second conductivity type.

An electrode metallic layer of the first conductivity type is formed on a rear face of the semiconductor substrate of the first conductivity type. When an electric current flows between the electrode metallic layer of the first conductivity type and the electrode metallic layer of the second conductivity type, light generated in the active layer is emitted from the approximately convex arc end face. A full angle at half maximum of this emitted light in a horizontal direction with respect to the substrate face is reduced in comparison with a case in which the light emitting end face approximately has a linear shape in a direction parallel to the substrate face.

However, implanted or injected carriers are diffused in a transversal direction when a distance between a contact portion of the electrode metallic layer of the second conductivity type for electric current injection and the center of curvature of the arc light emitting end face is excessively small. Accordingly, the implanted carriers enter a portion of the active layer between the center of curvature and the arc end face so that light is generated in this active layer portion. This light widens the full angle at half maximum of the emitted light in the horizontal direction with respect to the substrate face by the arc shape of the end face. Accordingly, it is not preferable to generate such light in the active layer portion. Therefore, the distance between the contact portion of the electrode metallic layer of the second conductivity type and the center of curvature of the arc light emitting end face is set to be larger than a diffusion length of the carriers. Thus, it is possible to restrain light from being generated in a regional portion between the center of curvature and the arc end face by implanting or injecting carriers to this regional portion. The diffusion length of the carriers is normally set to about 3 $\mu$m. Accordingly, the contact portion of the electrode metallic layer of the second conductivity type is preferably separated by at least 3 $\mu$m from the center of curvature of the arc light emitting end face in the second construction of the present invention. In this case, it is possible to further reduce the full angle at half maximum of the emitted light in the horizontal direction.

The third construction of the present invention uses a method for further reducing the number of carriers implanted into the active layer portion between the above center of curvature and the arc end face. In the third construction, a groove is formed from above until a depth which does not reach the active layer. This groove is located just close to a light emitting end face side of the contact portion of the electrode metallic layer of the second conductivity type such that this groove is perpendicular to a light emitting direction. In accordance with this third construction, it is also possible to further reduce the full angle at half maximum of the emitted light in the horizontal direction.

Light is generated from the semiconductor laminating structure laminated with the contact portion of the electrode metallic layer of the second conductivity type for electric current injection thereon. This light passes through a semiconductor laminating structure on which no contact portion of the electrode metallic layer of the second conductivity type is formed. This light is then taken as output light out of the arc end face. In this case, it is necessary to reduce a light loss caused by absorption of the output light in a light passing region. Therefore, it is desirable to construct the light passing region by a semiconductor layer having a forbidden band width wider than that of a semiconductor layer constituting the active layer. In the fourth construction, a clad layer of the second conductivity type is laminated with the layer structure after at least the active layer is removed from the light passing region. A height of the semiconductor laminating structure laminated with the contact portion of the electrode metallic layer of the second conductivity type is set to be different from the height of a semiconductor laminating structure on which no contact portion of the electrode metallic layer of the second conductivity type is formed. Thus, it is possible to construct the light passing region by only a semiconductor layer having a wider forbidden band width. As a result, it is possible to further reduce the full angle at half maximum of the emitted light in the horizontal direction. Simultaneously, an intensity of the emitted light can be increased.

In the above semiconductor light emitting element, a step difference is formed on the same semiconductor substrate such that the height of a substrate portion laminated with the semiconductor laminating structure for generating light and having the contact portion of the electrode metallic layer of the second conductivity type for electric current injection thereon is different from the height of a substrate portion laminated with a semiconductor laminating structure as a light passing region on which no contact portion of the electrode metallic layer of the second conductivity type is formed. These semiconductor laminating structures are set to be equal to each other. Further, in the fifth construction, a height of the step difference is desirably constructed such that a height of the active layer in the semiconductor laminating structure for generating light corresponds to the height of a semiconductor layer having a wider forbidden band width and located above or below the active layer. In this case, a semiconductor layer having a forbidden band width wider than that of the active layer can be manufactured as a light passing region without adding a process for removing a certain layer from the semiconductor laminating structure, etc. while manufacture of layers is interrupted during manufacture of the semiconductor laminating structure. Accordingly, the semiconductor light emitting element can be easily manufactured. Further, it is possible to further reduce the full angle at half maximum of the emitted light in the horizontal direction. Simultaneously, an intensity of the emitted light can be increased.

In the sixth construction of the above semiconductor light emitting element, the width of a semiconductor laminating structure having no electrode for electric current injection between the electrode and the forward light emitting end face in a direction perpendicular to a light emitting direction can be set to be wider than a width of the semiconductor laminating structure having the electrode for electric current injection in its upper portion in the direction perpendicular to the light emitting direction. Light is generated from the semiconductor laminating structure for generating light and having the electrode for electric current injection and is radiated in all directions. Accordingly, light radiated at an angle wider than a total reflection angle is emitted outside the width of the semiconductor laminating structure. Such light cannot pass through the semiconductor laminating structure in the light passing region in which no electrode for electric current injection is formed between the electrode and the forward light emitting end face. Accordingly, such light cannot be used as light taken out of the approximately arc light emitting end face. However, in the present invention, the width of the semiconductor laminating structure can be widened in the light passing region. Accordingly, light emitted outside the width of the semiconductor laminating structure in the same width case can be used as light taken out of the approximately arc light emitting end face. Therefore, an intensity of the emitted light can be further increased.

In the seventh construction of the semiconductor light emitting element having a semiconductor laminating structure similar to that of the first construction, the light emitting end face has a convex hyperbolic shape formed as a face approximately perpendicular to a Substrate face and extending in a horizontal direction with respect to the substrate face. The electrode for electric current injection formed in an upper portion of the semiconductor laminating structure is arranged on a rearer side in a direction opposite to the light emitting end face with respect to a perpendicular line. This perpendicular line is drawn perpendicularly with respect to a light emitting direction from an intersecting point between the hyperbolic light emitting end face and an element side face which is approximately perpendicular to the substrate face and is not formed in a hyperbolic shape. When an electric current flows between the electrode metallic layer of the first conductivity type and the electrode metallic layer of the second conductivity type, light generated in the active layer is emitted from the convex hyperbolic end face. A full angle at half maximum of this emitted light in the horizontal direction with respect to the substrate face is reduced in comparison with a case in which the light emitting end face approximately has a linear shape in a direction parallel to the substrate face. Further, in this seventh construction, spherical aberration of the emitted light is reduced in comparison with the first construction so that light convergence can be further improved. However, as explained in the second construction, light generated near the light emitting end face is not preferable since this light widens a radiant angle of the emitted light. In consideration of the diffusion length of implanted carriers, the electrode metallic layer of the second conductivity type in the eighth construction is arranged on a rearer side in a direction opposite to the hyperbolic light emitting end face with respect to a perpendicular line. This perpendicular line is drawn perpendicularly with respect to a light emitting direction from an intersecting point between the hyperbolic light emitting end face and an element side face which is approximately perpendicular to the substrate face and is not formed in a hyperbolic shape. The electrode metallic layer of the second conductivity type is separated by at least 3 $\mu$m from this perpendicular line. Thus, a full angle at half maximum of the emitted light in the horizontal direction is further reduced in the eighth construction. An operation and effects of each of the ninth to twelfth constructions are similar to those of each of the third to sixth constructions. In each of the ninth to twelfth constructions, the light emitting end face has a hyperbolic shape so that spherical aberration of the emitted light can be reduced and light convergence can be improved.

The semiconductor light emitting element based on each of the thirteenth to nineteenth constructions is provided to reduce a radiant angle of light emitted from the end face in a direction perpendicular to a substrate face.

The semiconductor light emitting element based on the thirteenth construction is formed by sequentially laminating a semiconductor clad layer of a first conductivity type, a semiconductor active layer for generating light, a semiconductor clad layer of a second conductivity type and a semiconductor electrode layer of the second conductivity type with each other on a semiconductor substrate of the first conductivity type. An electrode metallic layer of the second conductivity type is formed on the above semiconductor laminating structure. An electrode metallic layer of the first conductivity type is formed on a rear face of the semiconductor substrate. Thus, an electric current can be supplied between these two electrode metallic layers. The semiconductor clad layer has a forbidden band width wider than that of the active layer so that a so-called double hetero structure is formed. A refractive index of the semiconductor clad layer is reduced as the semiconductor clad layer is separated from the active layer. A refractive index of the active layer is greater than that of the semiconductor clad layer. Accordingly, a portion of light generated in the active layer by flowing an electric current through the semiconductor light emitting element is leaked into the clad layer so that this light portion is wave-guided into the clad layer. At this time, the clad layer having a refractive index distribution acts as a lens similar to a gradient index lens so that a radiant angle of light can be controlled.

Figure 11A:
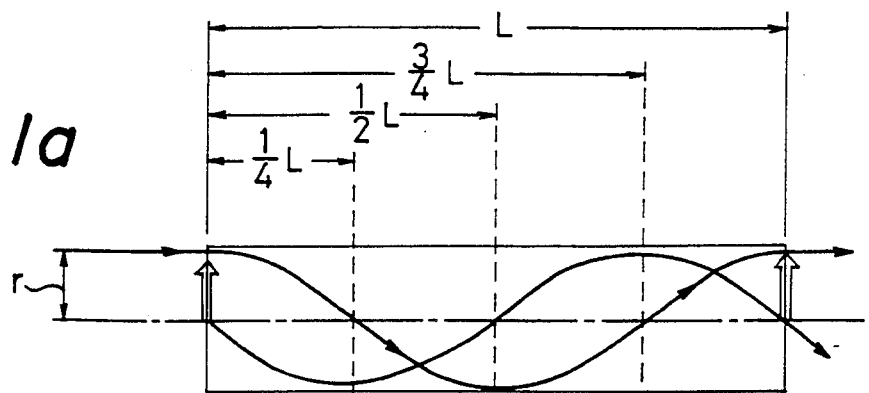
FIGS. 11a to 11d are views showing the relation between the length of a refractive index distribution type lens and an image formed by this lens.
Figure 11B:
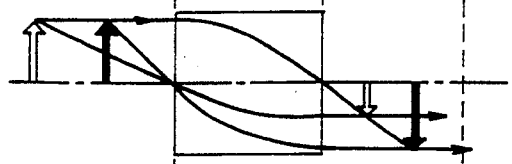
Figure 11C:
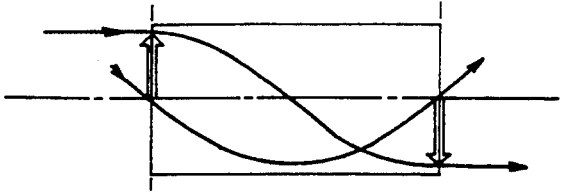
Figure 11D:
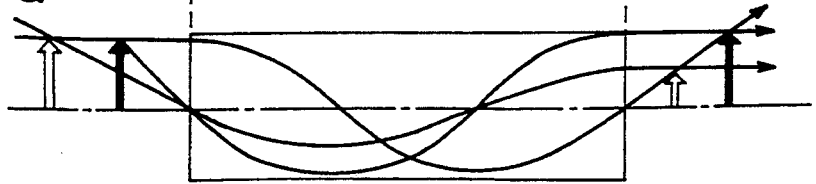

The gradient index lens can be set to an equal magnification image-forming element by adjusting its length. FIGS. 11a to 11d show the principle of this gradient index lens. In FIGS. 11a to 11d, L is a period determined by the radius r of a lens, a refractive index of this lens and a refractive index distribution. When a lens length is set to L, an equal magnification erect image with respect to an image shown by a white arrow at one end of the lens is formed at the other end of the lens as shown in FIG. 11a. When the lens length is set to L/4, an inverted real image is obtained as shown in FIG. 11b. When the lens length is set to L/2, an equal magnification inverted image with respect to an image shown by a white arrow at one end of the lens is formed at the other end of the lens as shown in FIG. 11c. When the lens length is set to 3L/4, an erect real image is formed as shown in FIG. 11d. Accordingly, an image can be focused in an arbitrary position by changing the lens length. For example, when the refractive index distribution n is represented by the following formula (1), $$n = n_0(1 - Ar^2/2) \qquad (1)$$

L can be represented by the following formula (2).

$$L = 2\pi/\sqrt{A} \qquad (2)$$

The clad layer having the refractive index distribution in the present invention acts as a flat plate-type gradient index lens having a refractive index distribution in only a thickness direction. Accordingly, an image can be focused in a linear shape parallel to a substrate face. In particular, in the sixteenth construction, a light non-emitting portion fulfilling only a lens function and having the double hetero structure is formed in front of a light emitting portion of the double hetero structure such that this light non-emitting portion has an arbitrary length. Thus, the width of light emitted in a direction perpendicular to the substrate face can be effectively reduced until a width of the light emitting portion (which is equal to a thickness of the active layer + the length of an evanescent wave). Further, in the present invention, lengths of the light emitting portion and a lens portion can be separately set. Accordingly, it is possible to separately control a diaphragming amount of the emitted light and an optical output intensity depending on the length of the light emitting portion.

The same semiconductor layer as the active layer in the lens functional portion fulfilling only a lens function functions as a layer for absorbing generated light in the above semiconductor light emitting element. Each of the seventeenth to nineteenth constructions is provided not to absorb the generated light into this light absorption layer. In each of the seventeenth to nineteenth constructions, the lens functional portion fulfilling only a lens function is formed in a light passing region on which no contact portion of the electrode metallic layer of the second conductivity type is formed. The lens functional portion is formed such that a height of the lens functional portion is different from that of the light emitting portion. Namely, the heights of regional portions of the semiconductor substrate having semiconductor laminating portions thereon are different from each other. A height of the active layer in the light emitting portion is set to be equal to the height of a clad layer having a wider forbidden band width in the lens functional portion fulfilling only a lens function. The semiconductor laminating structure can be formed on the substrate by an organic metal gaseous phase growing method using a gas and a MBE method in high vacuum while the shape of a step difference of the substrate is held. In particular, in the nineteenth construction, a refractive index of the clad layer is set to be highest in a position corresponding to the height of the active layer such that a lens function can be effectively fulfilled within the clad layer in the lens functional portion fulfilling only a lens function and corresponding to the height of the active layer of the light emitting portion. Further, the refractive index of the clad layer is set to be reduced as the clad layer is separated from this position. Namely, the refractive index of the clad layer is set to be reduced toward the active layer and the semiconductor layer for an electrode. The refractive index of a clad layer portion coming in contact with the active layer is set to be lower than that of the active layer. Thus, emitted light can be taken out of the semiconductor light emitting element through the lens functional portion without absorption of the emitted light.

The semiconductor light emitting element in each of the twentieth to twenty-third constructions has a structure for reducing a radiant angle of light in a horizontal direction with respect to a substrate face and a structure for reducing a radiant angle of light in a direction perpendicular to the substrate face. In this case, light can be further diaphragmed so that optical coupling efficiency with respect to a lens and an optical fiber can be further improved.

Figure 1B:
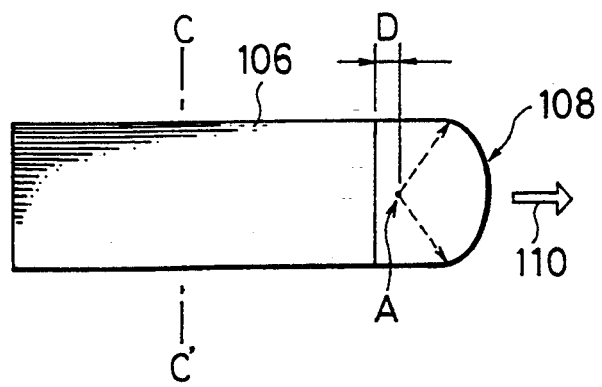
Figure 1C:
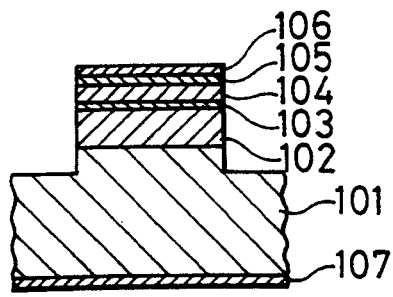

FIG. 1a is a perspective view of a semiconductor light emitting element in accordance with a first embodiment of the present invention. FIG. 1b is a plan view of the semiconductor light emitting element shown in FIG. 1a. FIG. 1c is a cross-sectional view taken along line C-C' of the semiconductor light emitting element shown in FIG. 1a.

As shown in FIGS. 1a and 1c, a so-called double hereto structure is used in the semiconductor light emitting element in the first embodiment. The double hereto structure is constructed by sequentially laminating an n-type $Al_{0.2}Ga_{0.8}As$ clad layer 102, a GaAs active layer 103, a p-type $Al_{0.2}Ga_{0.8}As$ clad layer 104 and a p-type GaAs electrode layer 105 with each other on an n-type GaAs substrate 101 by using an organic metal gaseous phase growing method. The n-type $Al_{0.2}Ga_{0.8}As$ clad layer 102 has a thickness of 1 $\mu m$ and a carrier concentration of $2 \times 10^{17}$. The GaAs active layer 103 has a thickness of 0.2 $\mu m$ and a carrier concentration of $1 \times 10^{15}$. The p-type $Al_{0.2}Ga_{0.8}As$ clad layer 104 has a thickness of 1 $\mu m$ and a carrier concentration of $5 \times 10^{17}$. The p-type GaAs electrode layer 105 has a thickness of 0.3 $\mu m$ and a carrier concentration of $6 \times 10^{18}$.

As shown by the plan view in FIG. 1b, a light emitting end face 108 in a light emitting direction 110 is formed in the shape of an arc perpendicular to an upper face of the substrate 101 and having a point A as a center of curvature in a direction parallel to the upper face of the substrate 101. In this embodiment, the arc has a radius of 24 μm. The other three sides of the laminating structure are formed to be perpendicular to the upper face of the substrate 101 such that these three sides are perpendicular to each other. These three sides perpendicular to the upper face of the substrate 101 and the light emitting end face 108 are formed by a dry etching method using a chlorine-including gas. An upper electrode 106 is made of Au—Zn/Au and is laminated and formed on tile laminating structure such that the upper electrode 106 is separated by a distance D from the center A of curvature in a direction opposite to the light emitting end face 108. The distance D is set to 5 μm in this embodiment. A lower electrode 107 is made of Au—Ge/Ni/Au and is formed on a rear face of the substrate 101. An optical output is obtained from the arc end face 108 by flowing an electric current between the upper electrode 106 and the lower electrode 107.

Figure 7A:
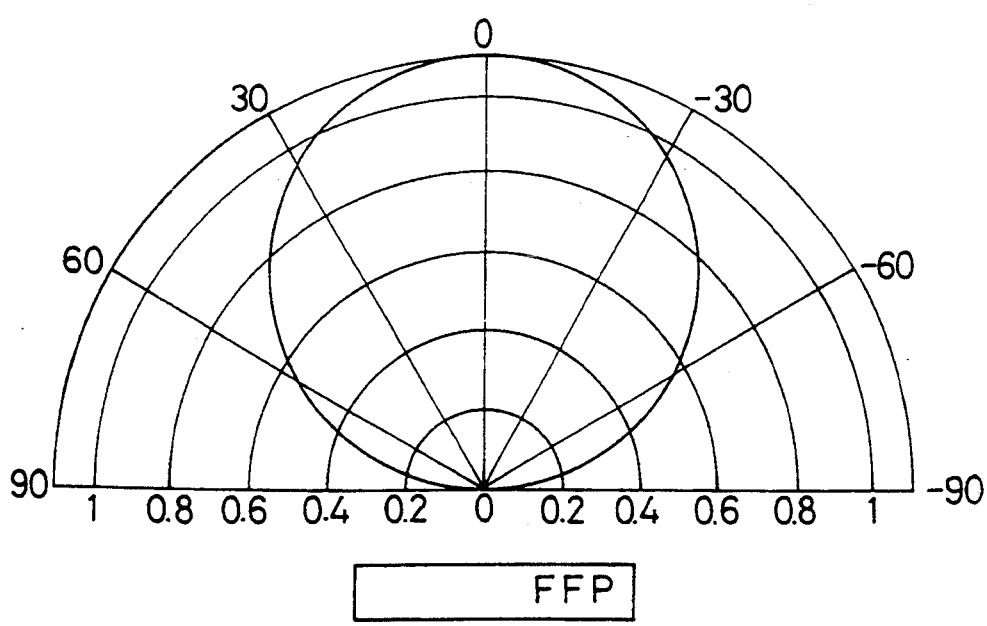
Figure 7B:
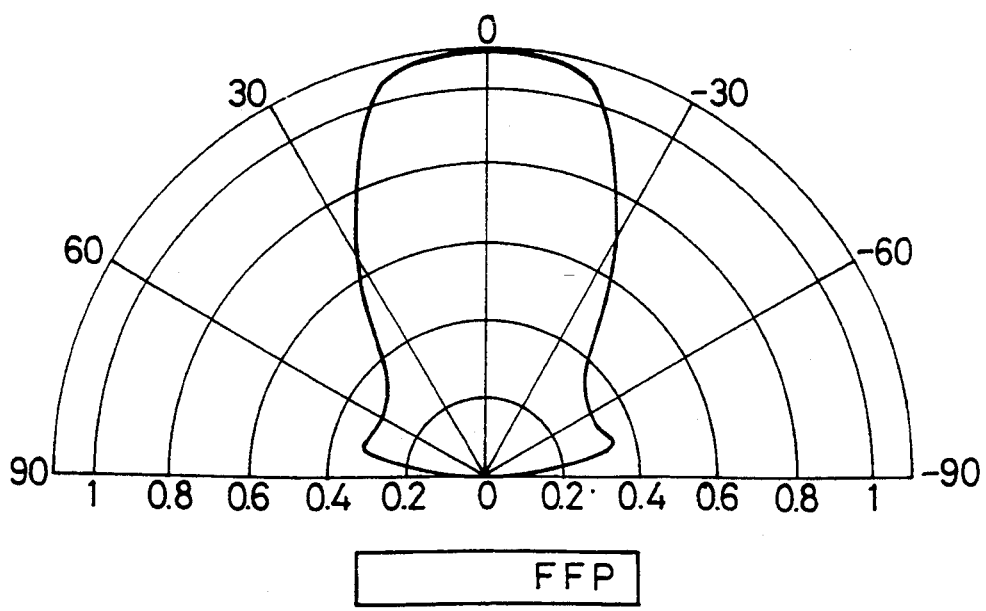

FIGS. 7a and 7b are views showing data at full angle at half maximum of optical outputs of a general semiconductor light emitting element of an end face light emitting type and the semiconductor light emitting element in the first embodiment of the present invention. FIG. 7a shows these data in a general case in which the light emitting end face is perpendicular to a light outputting direction and is planar. In FIG. 7a, about 120° is obtained as the full angle at half maximum. FIG. 7b shows this data in a case of the present invention in which the light emitting end face is formed in an arc shape. In FIG. 7b, about 76° is obtained as the full angle at half maximum.

Figure 2:
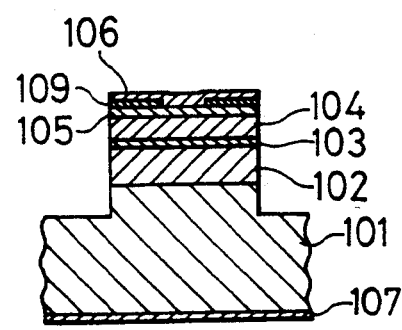
FIG. 2 is a cross-sectional view of a semiconductor light emitting element in accordance with a second embodiment of the present invention.

Similar to FIG. 1c, FIG. 2 is a cross-sectional view of a semiconductor light emitting element in accordance with a second embodiment of the present invention.

In the semiconductor light emitting element in the second embodiment, a silicon oxide film 109 is laminated and formed on a p-type GaAs electrode layer 105. A central portion of the silicon oxide film 109 is opened in the shape of a stripe having 10 μm in width in parallel with a light emitting direction. An electrode 106 is laminated and formed on this silicon oxide film 109 and is made of Au—Zn/Au. Accordingly, since an injected electric current is approximately concentrated to a central portion of the semiconductor light emitting element, light is also generated in the vicinity of the central portion of the semiconductor light emitting element. Therefore, an amount of light leaked to an outside portion from the arc of the light emitting end face 108 is reduced so that an amount of light passing through an arc portion is relatively increased. Thus, it is possible to increase an optical output of the semiconductor light emitting element.

Figure 3:
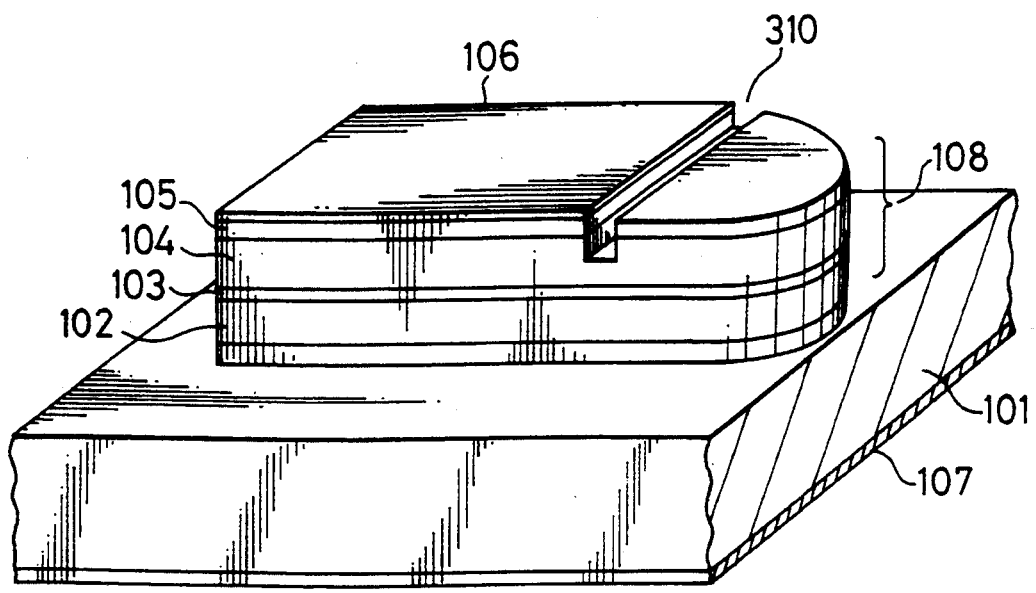
FIG. 3 is a perspective view of a semiconductor light emitting element in accordance with a third embodiment of the present invention.

FIG. 3 is a perspective view of a semiconductor light emitting element in accordance with a third embodiment of the present invention. A layer structure in this third embodiment is similar to that in the first embodiment.

In the semiconductor light emitting element in the third embodiment, an upper electrode 106 is made of Au—Zn/Au and is formed on a p-type GaAs electrode layer 105. A groove 310 is formed along a light emitting end face side of the upper electrode 106. The groove 310 approximately has a rectangular shape in cross section. The groove 310 is arranged outside the light emitting end face side of the upper electrode 106. The groove 310 has 5 μm in width and 0.6 μm in depth. The groove 310 is formed such that the groove 310 reaches a p-type Al$_{0.2}$Ga$_{0.8}$As clad layer 104 in a direction perpendicular to the light emitting direction. No groove 310 may come in contact with the upper electrode 106. The p-type GaAs electrode layer 105 has a lowest resistance. Accordingly, it is sufficient to form the groove 310 such that a depth of the groove 310 is deeper than at least a thickness of the electrode layer 105. In such a structure, it is possible to effectively restrain an electric current from being injected to a semiconductor laminating structure between the upper electrode 106 and a light emitting end face 108. The semiconductor light emitting element in this third embodiment can be also applied to the second embodiment.

Figure 4A:
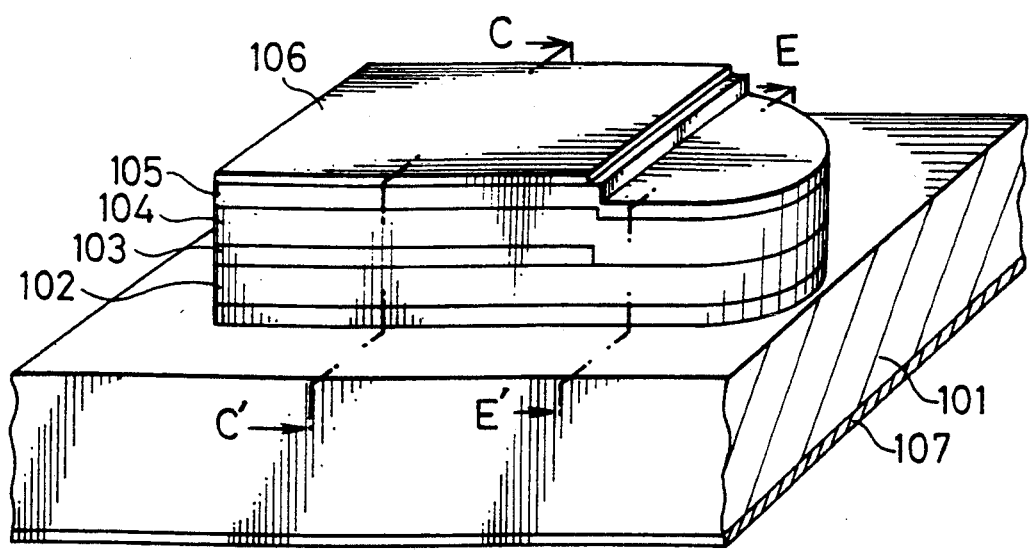
FIG. 4a is a perspective view of a semiconductor light emitting element in accordance with a fourth embodiment of the present invention.
Figure 4B:
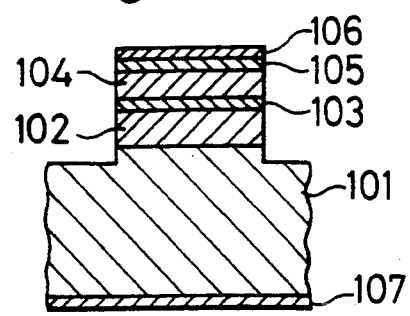
Figure 4C:
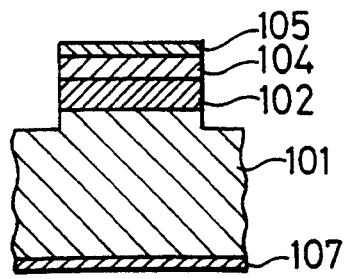

FIG. 4a is a perspective view of a semiconductor light emitting element in accordance with a fourth embodiment of the present invention. FIG. 4b is a cross-sectional view taken along line C-C' of the semiconductor light emitting element shown in FIG. 4a. FIG. 4c is a cross-sectional view taken along line E-E' of the semiconductor light emitting element shown in FIG. 4a.

In the semiconductor light emitting element in the fourth embodiment, an n-type Al$_{0.2}$Ga$_{0.8}$As clad layer 102 and a GaAs active layer 103 are laminated and formed on an n-type GaAs substrate 101 by an organic metal gaseous phase growing method. The n-type Al$_{0.2}$Ga$_{0.8}$As clad layer 102 has a thickness of 1 μm and a carrier concentration of $2 \times 10^{17}$. The GaAs active layer 103 has a thickness of 0.2 μm and a carrier concentration of $1 \times 10^{15}$. Thereafter an active layer portion in a regional portion for only passing light therethrough without generating light is formed between an electrode and a light emitting end face having an arc shape. This active layer portion is removed from the semiconductor light emitting element by wet etching. Thereafter, a p-type Al$_{0.2}$Ga$_{0.8}$As clad layer 104 and a p-type GaAs electrode layer 105 are again laminated and formed on the removed layer structure by the organic metal gaseous phase growing method. The p-type Al$_{0.2}$Ga$_{0.8}$As clad layer 104 has a thickness of 1 μm and a carrier concentration of $5 \times 10^{17}$. The p-type GaAs electrode layer 105 has a thickness of 0.3 μm and a carrier concentration of $6 \times 10^{18}$. The arc light emitting end face and the other three sides are formed by dry etching using a chloride-including gas such that the arc light emitting end face and the other three sides are perpendicular to a substrate face. In this case, since the organic metal gaseous phase growing method is used as a laminating method, the layers can be laminated with each other while step differences formed in the wet etching are held. Accordingly, a step difference is similarly formed in the uppermost electrode layer 105. A wet etching liquid can be constructed by using an aqueous solution of sulfuric acid hydrogen peroxide, an ammonia aqueous solution, etc. An electrode 106 is made of Au—Zn/Au and is formed on only a layer portion having the active layer 103. A sectional portion of FIG. 4b taken along line C-C' of FIG. 4a also shows a so-called double hetero structure. A sectional portion of FIG. 4c taken along line E-E' of FIG. 4a shows a layer structure in which the active layer 103 is removed from the double hetero structure. The width of a forbidden band of each of the clad layers 102 and 104 above and below the active layer 103 is wider than that of the active layer 103. Accordingly, the clad layers 102 and 104 can be set to be transparent with respect to light generated in the active layer 103. Therefore, taking-out efficiency of light from the arc light emitting end face can be improved.

Figure 5:
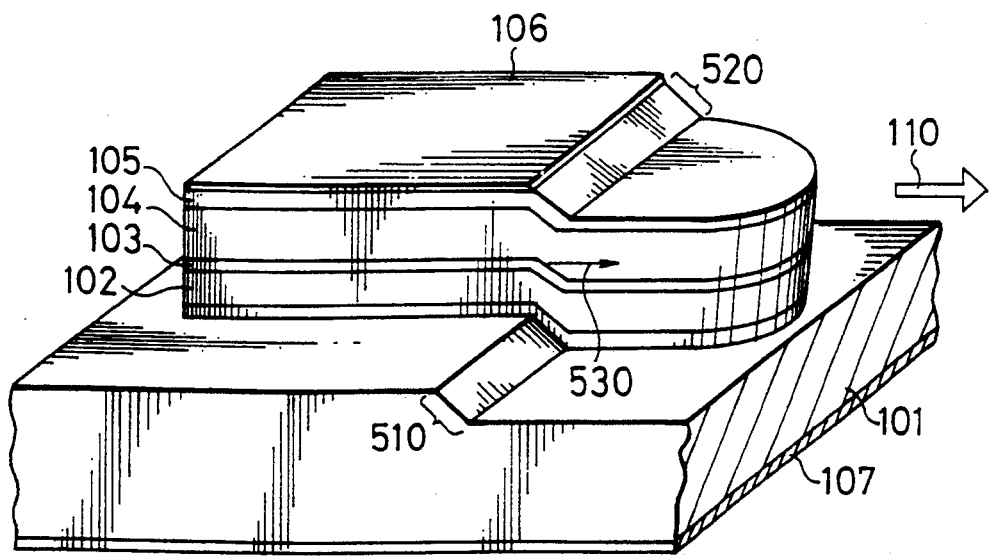
FIG. 5 is a cross-sectional view of a semiconductor light emitting element in accordance with a fifth embodiment of the present invention.

FIG. 5 is a perspective view of a semiconductor light emitting element in accordance with a fifth embodiment of the present invention. A semiconductor laminating structure in the fifth embodiment is similar to that in the first embodiment. In this fifth embodiment, a substrate face as a regional portion for only passing light therethrough without generating light is formed between an arc light emitting end face and an electrode. A p-type GaAs electrode layer 105 is laminated and formed on another substrate face. The p-type GaAs electrode layer 105 has a thickness of 0.3 μm and a carrier concentration of $6 \times 10^{18}$. A step difference 510 is formed between these substrate faces. A so-called double hetero structure is laminated and formed on this step difference by an organic metal gaseous phase growing method. In the fifth embodiment, a (100) GaAs substrate is used and a direction perpendicular to a light emitting direction is set to the following Z-direction.

$$Z = [0\bar{1}1]$$

When an aqueous solution of sulfuric acid, hydrogen peroxide and water in a ratio of 1:8:1 is used, the step difference 510 is formed in a sequential mesa shape in a direction perpendicular to the light emitting direction. A step difference 520 is similarly formed in a semiconductor layer laminated and formed on the step difference 510. Namely, in this fifth embodiment, an electrode portion is formed such that this electrode portion is high. A height of this step difference must be set to be smaller than the thickness of a p-type $Al_{0.2}Ga_{0.8}As$ clad layer 104. Thus, light 530 generated in an active layer 103 passes through a layer having a wider forbidden band and is taken out as an optical output. Accordingly, it is possible to set a light passing region as a layer having a forbidden band wider than that of the active layer 103 without intermediate interruption of layer growth.

Figure 6:
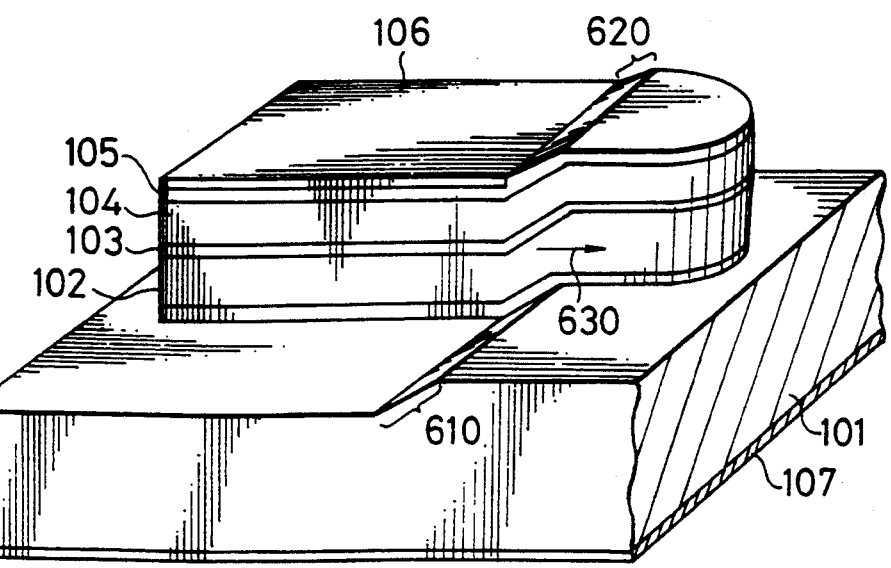
FIG. 6 is a perspective view of a semiconductor light emitting element in accordance with a sixth embodiment of the present invention.

FIG. 6 is a perspective view of a semiconductor light emitting element in accordance with a sixth embodiment of the present invention. In this sixth embodiment, a step difference 610 is formed by a growing method similar to that in the fifth embodiment. Further, a step difference 620 is similarly formed on a laminating structure. In contrast to the fifth embodiment, the height of an electrode portion is reduced in this sixth embodiment. A height of this step difference must be set to be smaller than the thickness of an n-type $Al_{0.2}Ga_{0.8}As$ clad layer 102. Thus, effects similar to those in the fifth embodiment can be obtained.

Figure 8:
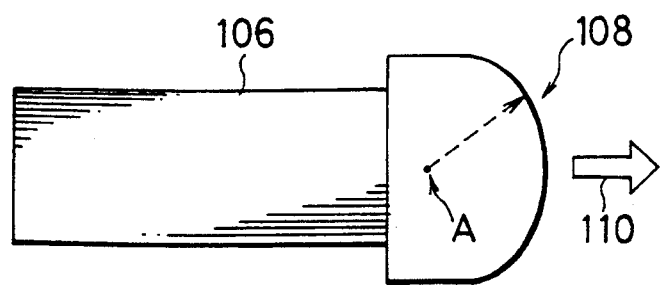
FIG. 8 is a plan view of a semiconductor light emitting element in accordance with a seventh embodiment of the present invention.
Figure 9:
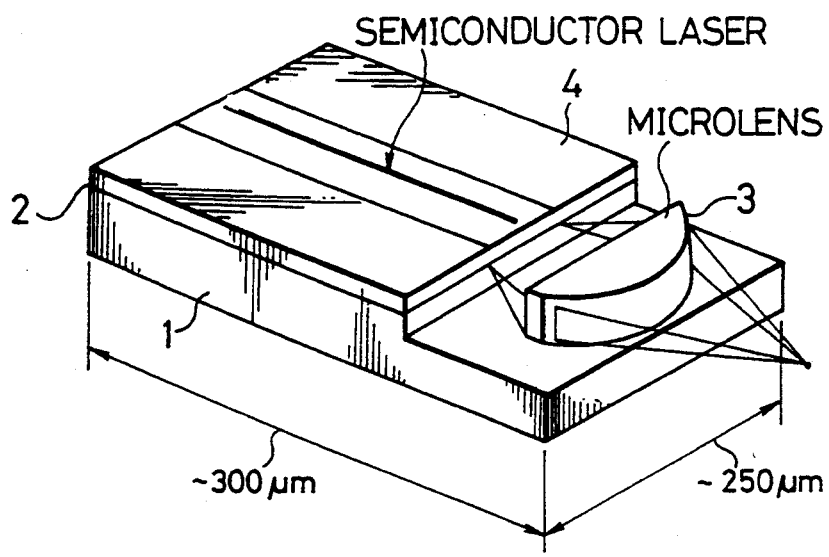
FIG. 9 is a perspective view of a semiconductor laser of a microlens integrated type showing one example of a general technique.

FIG. 8 is a plan view of a semiconductor light emitting element in accordance with a seventh embodiment of the present invention.

In this seventh embodiment, a portion of a semiconductor laminating structure, as a region for only passing light therethrough without generating light, is formed between an arc light emitting end face 108 and an electrode 106. A width of this laminating structural portion in a direction perpendicular to a light emitting direction 110 is set to be wider than the width of a portion of the semiconductor laminating structure on which an electrode 106 is formed. In FIG. 8, a point A shows a center of curvature of the arc end face 108. The electrode 106 is arranged such that the electrode 106 is far from the arc end face 108 in comparison with the center A of curvature. When the widths of the laminating structural portions are equal to each other, light is generated from the semiconductor laminating structure having the electrode 106 for electric current injection and generating light, and is radiated in all directions. Accordingly, light radiated at an angle wider than a total reflection angle is emitted outside the width of the semiconductor laminating structure. This light cannot pass through the semiconductor laminating structure in the light passing region in which no electrode is formed between the electrode and the forward light emitting end face 108. Accordingly, this light cannot be approximately used as light taken out of the arc light emitting face 108. However, in this seventh embodiment, the width of a semiconductor laminating structural portion in the light passing region is set to be wider than that of another laminating structural portion on which the electrode 106 is formed. Accordingly, light emitted outside the width of the semiconductor laminating structure in the case of the same width with respect to these laminating structural portions can be approximately taken out of the arc light emitting end face 108 in the seventh embodiment. Therefore, an intensity of the emitted light can be further increased.

Figure 12A:
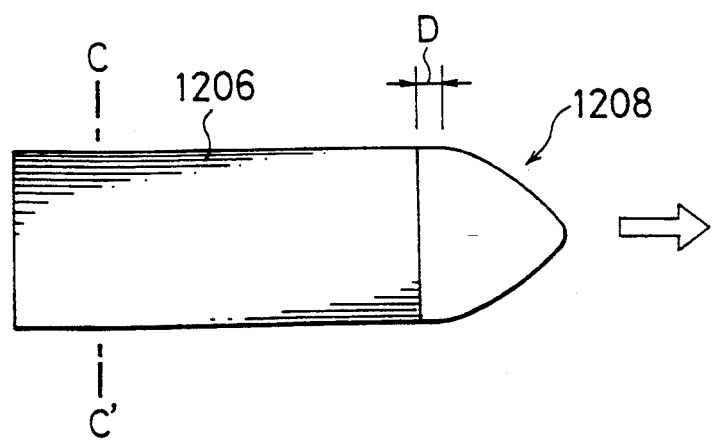
FIG. 12a is a plan view of a semiconductor light emitting element in accordance with an eighth embodiment of the present invention.
Figure 12B:
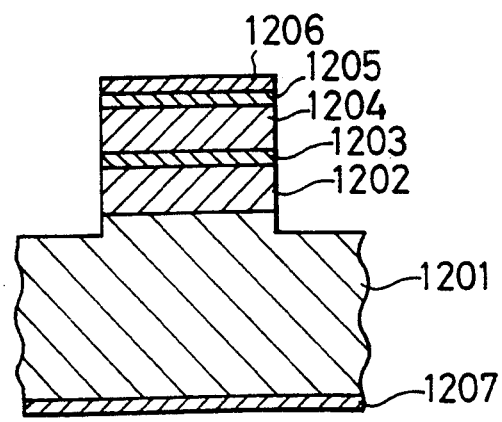

FIG. 12a is a plan view of a semiconductor light emitting element in accordance with an eighth embodiment of the present invention. FIG. 12b is a cross-sectional view taken along line C–C' of the semiconductor light emitting element shown in FIG. 12a. The semiconductor light emitting element in this eighth embodiment has a so-called double hetero structure. The double hereto structure is constructed by sequentially laminating an n-type $Al_{0.2}Ga_{0.8}As$ clad layer 1202, a GaAs active layer 1203, a p-type $Al_{0.2}Ga_{0.8}As$ clad layer 1204 and a p-type GaAs electrode layer 1205 with each other on an n-type GaAs substrate 1201 by using an organic metal gaseous phase growing method. Reference numerals 1206 and 1207 respectively designate upper and lower electrodes.

A layer structure of the semiconductor light emitting element in the eighth embodiment is similar to that in the first embodiment shown in FIGS. 1a to 1c. However, a light emitting end face 1208 in the eighth embodiment has a hyperbolic shape in a horizontal direction with respect to a substrate face. Reference numeral D designates a distance from a boundary between a hyperbolic portion and a linear portion to the upper electrode 1206.

Similar to the embodiment shown in FIGS. 12a and 12b, a shape of the light emitting end face in the horizontal direction parallel to the substrate face may be set to be hyperbolic in each of the embodiments shown in FIGS. 3 to 6 and 8. Spherical aberration of the light emitting end face in the case of the hyperbolic shape can be reduced in comparison with the arc shape.

Figure 10:
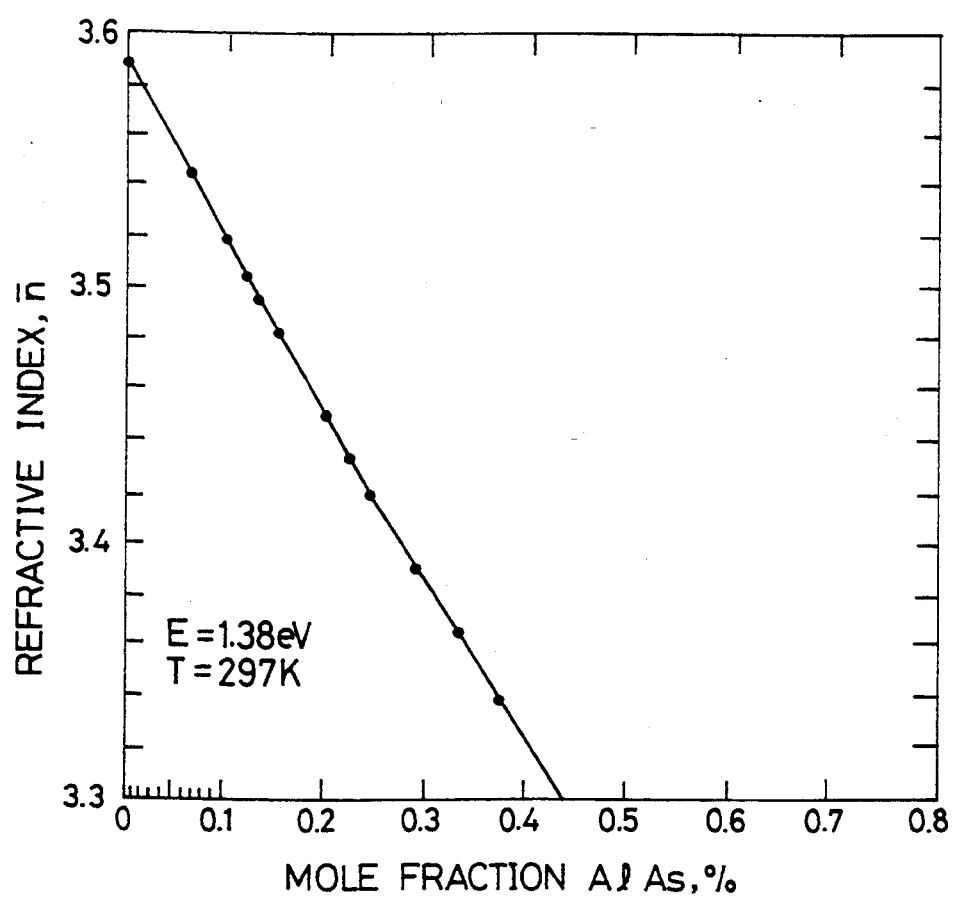
FIG. 10 is a graph showing the relation between an aluminum composition and a refractive index of AlGaAs.
Figure 13A:
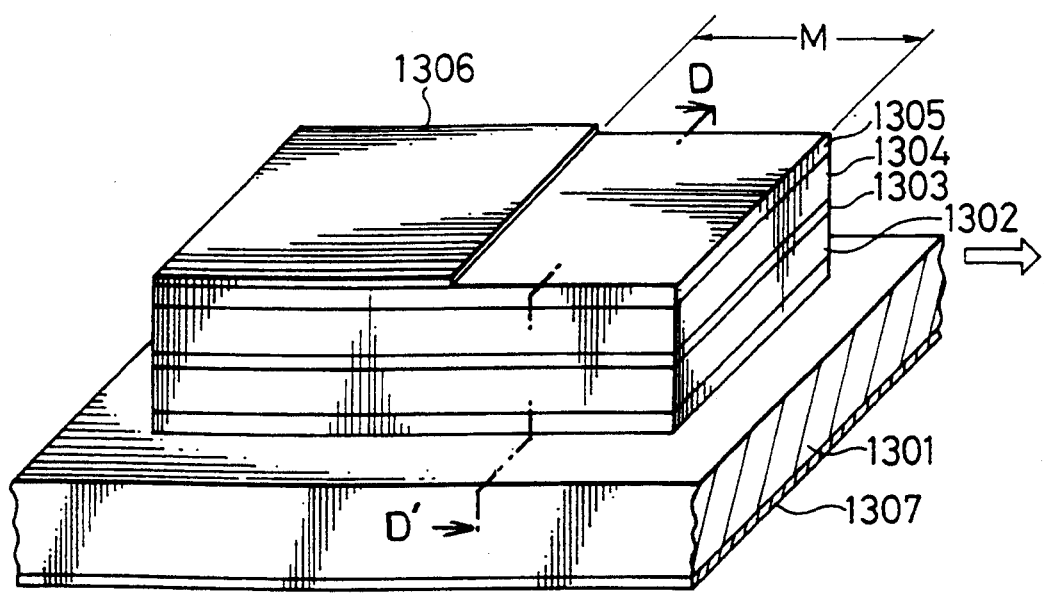
FIG. 13a is a perspective view of a semiconductor light emitting element in accordance with a ninth embodiment of the present invention.
Figure 13B:
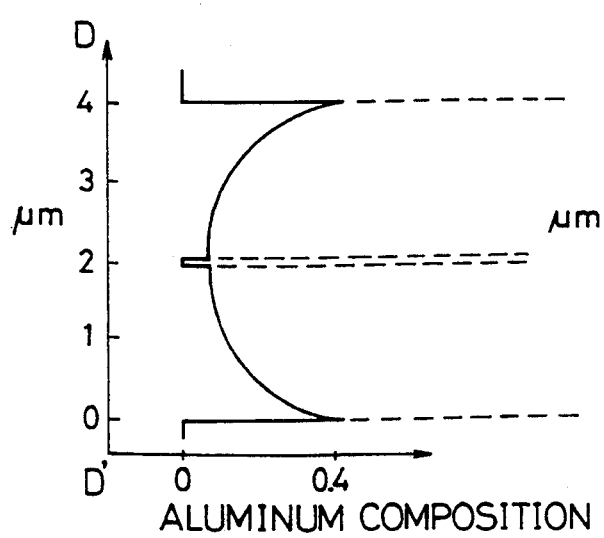
Figure 13C:
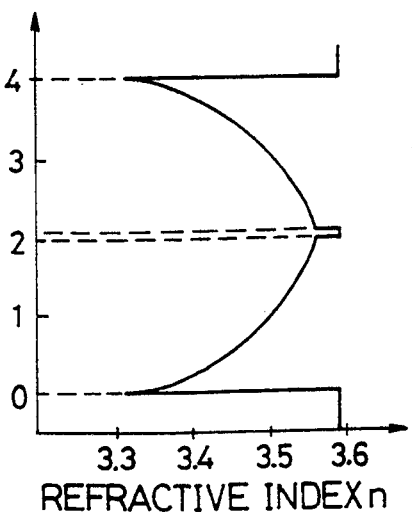

FIG. 13a is a perspective view of a semiconductor light emitting element in accordance with a ninth embodiment of the present invention. Each of FIGS. 13b and 13c is a view showing an aluminum composition and a refractive index distribution taken along a sectional line D–D' of the semiconductor light emitting element shown in FIG. 13a. FIG. 10 shows the relation between an aluminum composition and a refractive index of AlGaAs. The aluminum composition and the refractive index distribution are shown with respect to only a semiconductor laminating structure on an n-type GaAs substrate 1301. In each of FIGS. 13b and 13c, an axis of ordinate shows a layer thickness and an axis of abscissa shows the aluminum composition and the corresponding refractive index.

In the semiconductor light emitting element in the ninth embodiment, an n-type clad layer 1302, a GaAs active layer 1303, a p-type clad layer 1304 and a p-type GaAs electrode layer 1305 are sequentially laminated with each other on the n-type GaAs substrate 1301. The n-type clad layer 1302 has a thickness of 2 μm. The aluminum composition of the n-type clad layer 1302 is continuously changed from 0.4 to 0.07. The GaAs active layer 1303 has a thickness of 0.05 μm. The p-type clad layer 1304 has a thickness of 2 μm. The aluminum composition of the p-type clad layer 1304 is continuously changed from 0.4 to 0.07. The p-type GaAs electrode layer 1305 has a thickness of 0.5 μm. An upper metallic electrode 1306 and a lower metallic electrode 1307 are similar to those in the first embodiment.

As shown in FIG. 13c, the refractive index distribution is set in accordance with the above-mentioned formula (1) from 3.321 in the case of aluminum composition 0.4 to 3.56 in the case of aluminum composition 0.07. r=2 μm is obtained so that L=34.2 μm is formed from the above-mentioned formula (2). Accordingly, as shown in FIGS. 11a to 11d, inverted and erect images of a light emitting portion in a horizontal direction with respect to a substrate face are formed on an element end face or in positions separated from the element end face according to the length M of an element portion for fulfilling only a lens function in relation to the lens length L. In this case, no means for converging light is arranged in the horizontal direction so that an image greatly extending in a transversal direction is obtained.

Figure 14A:
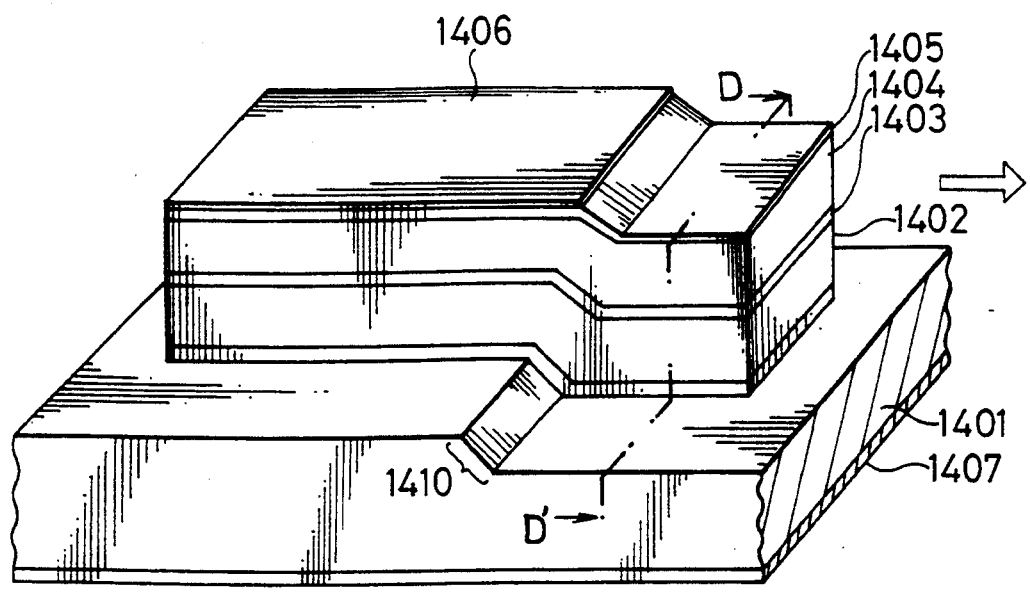
FIG. 14a is a perspective view of a semiconductor light emitting element in accordance with a tenth embodiment of the present invention.
Figure 14B:
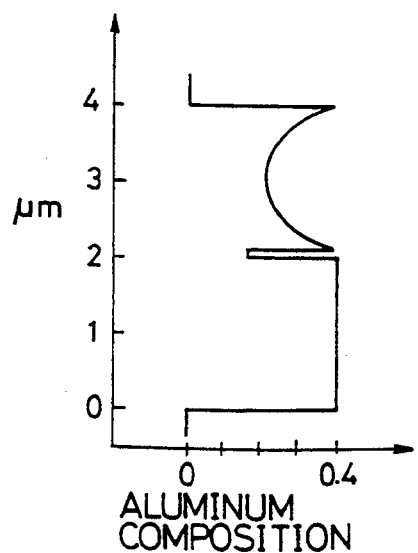
Figure 14C:
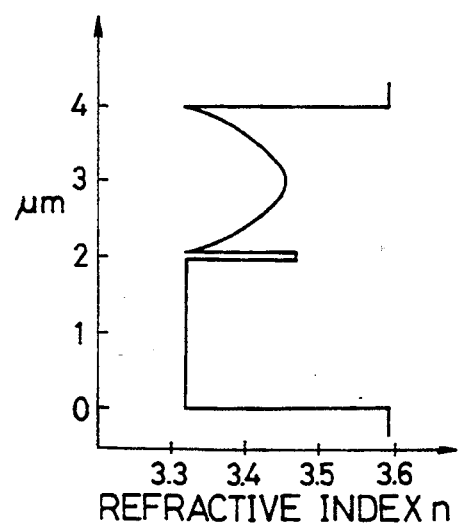

FIG. 14a is a perspective view of a semiconductor light emitting element in accordance with a tenth embodiment of the present invention. Each of FIGS. 14b and 14c is a view showing an aluminum composition and a refractive index distribution taken along a sectional line D-D' of the semiconductor light emitting element shown in FIG. 14a. FIG. 10 shows the relation between an aluminum composition and a refractive index of AlGaAs. The aluminum composition and the refractive index distribution are shown with respect to only a semiconductor laminating structure on an n-type GaAs substrate 1401. In each of FIGS. 14b and 14c, an axis of ordinate shows a layer thickness and an axis of abscissa shows the aluminum composition and the corresponding refractive index.

In the semiconductor light emitting element in the tenth embodiment, an n-type clad layer 1402, an active layer 1403 made of AlGaAs, a p-type clad layer 1404 and a p-type GaAs electrode layer 1405 are sequentially laminated with each other on the n-type GaAs substrate 1401. The n-type clad layer 1402 has a thickness of 2 μm. The aluminum composition of the n-type clad layer 1402 is set to 0.4. The active layer 1403 has a thickness of 0.05 μm. The aluminum composition of the active layer 1403 is set to 0.18. The p-type clad layer 1404 has a thickness of 2 μm. The aluminum composition of the p-type clad layer 1404 is changed from 0.4 to 0.2. The p-type GaAs electrode layer 1405 has a thickness of 0.5 μm. An upper metallic electrode 1406 and a lower metallic electrode 1407 are similar to those in the first embodiment.

In this tenth embodiment, the substrate 1401 is formed such that a step difference 1410 of the substrate is equal to 1 μm. Accordingly, the active layer of a light emitting portion is located in a middle position of the p-type clad layer 1404. Therefore, the aluminum composition and the refractive index in the middle position are respectively set to 0.4 and 3.321. The aluminum composition and the refractive index of each of element portions coming in contact with the active layer 1403 and the electrode layer 1405 are respectively set to 0.2 and 3.452. In this case, L=23.0 μm is obtained from the above-mentioned formulas (1) and (2). Accordingly, as shown in FIGS. 11a to 11d, inverted and erect images of the light emitting portion in a horizontal direction with respect to a substrate face are formed on an element end face or in positions separated from the element end face according to the length M of an element portion for fulfilling only a lens function in relation to the lens length L. In this case, no means for converging light is arranged in the horizontal direction so that an image greatly extending in a transversal direction is obtained.

In an eleventh embodiment of the present invention, the same composition and refractive index distributions as FIGS. 13b and 13c are obtained by changing each of the aluminum compositions of the n-type clad layer 104 and the p-type clad layer 102 in the first embodiment shown in FIGS. 1a to 1c from 0.4 to 0.2. Thus, inverted and erect images of a light emitting portion in a horizontal direction with respect to a substrate face are formed on an element end face or in positions separated from the element end face. Further, a horizontal length of each of these images can, be approximately reduced until a width of the light emitting portion. Similarly, the same composition and refractive index distributions as FIGS. 14b and 14c can be obtained in the embodiment shown in FIG. 5 so that effects similar to those in the tenth embodiment can be obtained in the embodiment of FIG. 5.

In the semiconductor light emitting element of the present invention, it is not necessary to set the shape of a light emitting end face in a horizontal direction to an accurate convex arc or hyperbolic shape in a light emitting direction at any time as a means for reducing a radiant angle of light in the horizontal direction with respect to a substrate face. When no required light is strictly diaphragmed, the end face shape may be set to be convex in the light emitting direction.

In the semiconductor light emitting element of the present invention, the semiconductor laminating structure is explained by using the GaAs active layer and the AlGaAs clad layer as one example. However, the present invention can be also applied to an AlGaAs active layer and an AlGaAs clad layer having a wider forbidden band width. Further, the present invention can be applied to a laminating structure having an InP substrate, an InGaAsP active layer and an InGaP active layer. Further, the present invention can be applied to a semiconductor laminating structure having each of active layers made of InGaAsP, InGaAlP, GaAsP, ZnSe, CdZnSe, CaZnS, ZnSSe. The present invention can be applied to an array structure of light emitting elements. A molecular beam epitaxial growing method (MBE method) can be also used as a method for forming a film.

As mentioned above, in a semiconductor light emitting element having a first construction, a light emitting end face approximately has an arc shape in a direction parallel to a semiconductor substrate face. An electrode for electric current injection is formed in an upper portion of a semiconductor laminating structure and is arranged in a position separated from at least a center of curvature of the arc light emitting end face. Accordingly, a full angle at half maximum of light emitted from the approximately convex arc end face in a horizontal direction with respect to the substrate face can be reduced in comparison with a case in which the light emitting end face approximately has a linear shape in a direction parallel to the substrate face. Accordingly, optical coupling efficiency with respect to an optical fiber, a lens, etc. can be improved so that light utilization efficiency can be improved. Further, it is possible to solve problems about manufacture of a semiconductor device using a combination of a light emitting element and a lens system.

In a semiconductor light emitting element having a second construction, an electrode for electric current injection formed in the upper portion of the semiconductor laminating structure is arranged in a position separated by at least 3 μm from the center of curvature of the arc light emitting end face. Accordingly, it is possible to restrain light from being generated in a regional portion between the center of curvature and the arc light emitting end face by implanting carriers to this regional portion. Therefore, it is possible to reduce the full angle at half maximum of the emitted light in the horizontal direction.

In a semiconductor light emitting element having a third construction, the electrode for electric current injection formed in the upper portion of the semiconductor laminating structure is arranged in a position separated from at least the center of curvature of the arc light emitting end face. A groove is formed from the upper portion of the semiconductor laminating structure between the light emitting end face and the electrode for electric current injection until a depth which does not reach a light generating portion in the vicinity of a junction portion. Accordingly, it is possible to reduce the number of carriers implanted into an active layer portion between the center of curvature and the arc light emitting end face. Therefore, it is possible to further reduce the full angle at half maximum of the emitted light in the horizontal direction.

In a semiconductor light emitting element having a fourth construction, a height of the semiconductor laminating structure having the electrode for electric current injection in its upper portion is different from the height of a semiconductor laminating structure having no electrode for electric current injection between the electrode and the forward light emitting end face. Light generated within the semiconductor laminating structure having the electrode for electric current injection can pass through a layer of the semiconductor laminating structure having no electrode for electric current injection and having a forbidden band width wider than that of a semiconductor layer generating the light. Accordingly, it is possible to further reduce the full angle at half maximum of the emitted light in the horizontal direction. Simultaneously, an intensity of the emitted light can be increased.

In a semiconductor light emitting element having a fifth construction, the semiconductor laminating structure having the electrode for electric current injection in its upper portion is equal to the semiconductor laminating structure having no electrode for electric current injection between the electrode and the forward light emitting end face. The height of a semiconductor substrate portion laminated with the semiconductor laminating structure having the electrode for electric current injection in its upper portion is different from the height of a semiconductor substrate portion laminated with the semiconductor laminating structure having no electrode for electric current injection between the electrode and the forward light emitting end face so that a step difference is formed between these semiconductor substrate portions. Accordingly, the semiconductor light emitting element can be easily manufactured and it is possible to further reduce the full angle at half maximum of the emitted light in the horizontal direction. Simultaneously, an intensity of the emitted light can be increased.

In a semiconductor light emitting element having a sixth construction, a width of the semiconductor laminating structure having no electrode for electric current injection between the electrode and the forward light emitting end face in a direction perpendicular to a light emitting direction is wider than a width of the semiconductor laminating structure having the electrode for electric current injection in its upper portion in the direction perpendicular to the light emitting direction. Accordingly, light emitted outside the width of the semiconductor laminating structure in the same width case can be used as light taken out of the approximately arc light emitting end face. Therefore, an intensity of the emitted light can be further increased.

In a semiconductor light emitting element having a seventh construction, spherical aberration can be reduced in addition to the effects of the first construction.

In a semiconductor light emitting element having an eighth construction, approximately similar to the second construction, a distance between a hyperbolic light emitting end face and an injecting portion of an electric current from an electrode for electric current injection is set to be sufficiently large. Accordingly, it is possible to reduce a component of output light widened by the hyperbolic end face. Therefore, a radiant angle of emitted light in a horizontal direction with respect to a substrate face can be effectively reduced, and spherical aberration can be further reduced.

In a semiconductor light emitting element having a ninth construction, the flow of an electric current toward the light emitting end face is stopped by a formed groove. Accordingly, it is possible to effectively reduce a component of output light widened by the curved end face in comparison with the semiconductor light emitting element having the eighth construction. Therefore, the radiant angle of the emitted light in the horizontal direction with respect to the substrate face can be effectively reduced, and spherical aberration can be further reduced.

In a semiconductor light emitting element having a tenth construction, similar to the effects of the fourth construction, it is possible to reduce light absorption caused by the active layer so that an optical output can be increased. Further, spherical aberration can be reduced.

In a semiconductor light emitting element having an eleventh construction, spherical aberration can be reduced in addition to the effects of the fifth construction.

In a semiconductor light emitting element having a twelfth construction, spherical aberration can be reduced in addition to the effects of the sixth construction.

In a semiconductor light emitting element having a thirteenth construction, it is possible to reduce a radiant angle of light emitted from the light emitting end face in a direction perpendicular to a substrate face.

In a semiconductor light emitting element having each of fourteenth and fifteenth constructions, it is possible to more effectively reduce the radiant angle of light emitted from the light emitting end face in the direction perpendicular to the substrate face. In the fourteenth construction, this radiant angle can be greatly reduced.

In a semiconductor light emitting element having a sixteenth construction, it is possible to independently control the length of a light emitting portion and a lens functional portion fulfilling a lens function and controlling the radiant angle of light. Accordingly, the intensity of an optical output can be arbitrarily set. Further, the radiant angle of light in the direction perpendicular to the substrate face can be reduced and an image can be focused in an arbitrary position by adjusting a length of the lens functional portion.

In a semiconductor light emitting element having each of seventeenth and eighteenth constructions, in addition to the effects of the sixteenth construction, no light passing through the lens functional portion passes through the same layer as an active layer in the light emitting portion. Accordingly, a light absorption amount is reduced and stronger output light can be obtained. Further, in the eighteenth construction, a laminating structure of the lens functional portion is equal to that of the light emitting portion so that a laminating structure of the semiconductor light emitting element can be easily formed.

In a semiconductor light emitting element having a nineteenth construction, the position of a clad layer of the lens functional portion providing a highest refractive index with respect to a refractive index distribution is set to be in conformity with a position of the active layer of the light emitting portion. Accordingly, the radiant angle of light in the direction perpendicular to the substrate face can be more effectively reduced. Further, since no light passing through the lens functional portion passes through the same layer as the active layer in the light emitting portion, a light absorption amount is reduced and stronger output light can be obtained.

In a semiconductor light emitting element having a twentieth construction, the effects of the thirteenth construction can be obtained in addition to the effects of the first construction. Accordingly, radiant angles of light in both directions parallel and perpendicular to the substrate face can be reduced.

In a semiconductor light emitting element having a twenty-first construction, the effects of each of the seventeenth, eighteenth and nineteenth constructions can be obtained in addition to the effects of the fourth construction. Accordingly, the radiant angles of light in both the directions parallel and perpendicular to the substrate face can be reduced.

In a semiconductor light emitting element having a twenty-second construction, the effects of the thirteenth construction can be obtained in addition to the effects of the seventh construction. Accordingly, the radiant angles of light in both the directions parallel and perpendicular to the substrate face can be reduced.

In a semiconductor light emitting element having a twenty-third construction, the effects of the thirteenth construction can be obtained in addition to the effects of the tenth construction. Accordingly, the radiant angles of light in both the directions parallel and perpendicular to the substrate face can be reduced.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor light emitting element comprising:
   a layer-stacked structure of semiconductor layers formed on a semiconductor substrate and having a junction portion formed in parallel with a semiconductor substrate face;
   a light generating portion formed in the vicinity of the junction portion such that an electric current can be injected into the light generating portion;
   a light emitting end face formed on a side face of the layer-stacked structure and approximately having an arc shape in a direction parallel to the semiconductor substrate face; and
   an electrode for electric current injection formed in an upper portion of the layer-stacked structure and arranged in a position apart from the arc shaped light emitting end face in the direction parallel to the semiconductor substrate face by a distance more than at least a radius of curvature of the arc shaped light emitting end face.

2. A semiconductor light emitting element as claimed in claim 1, wherein the electrode for electric current injection formed in the upper portion of the layer-stacked structure is arranged in a position apart from the arc shaped light emitting end face in the direction parallel to the semiconductor substrate face by a distance at least 3 $\mu$m more than the radius of curvature of the arc shaped light emitting end face.

3. A semiconductor light emitting element as claimed in claim 1 or 2, wherein a groove is formed from the upper portion of the layer-stacked structure between the light emitting end face and the electrode for electric current injection until a depth which does not reach the light generating portion in the vicinity of the junction portion.

4. A semiconductor light emitting element as claimed in claim 1 or 2, wherein a height in a part of the layer-stacked structure having the electrode for electric current injection in its upper portion is different from a height in an another part of the layer-stacked structure having no electrode for electric current injection in its upper portion between the electrode and the light emitting end face; and
   light generated within the part of the layer-stacked structure having the electrode for electric current injection can pass through a layer in said another part of the layer-stacked structure having no electrode for electric current injection and having a forbidden band width than that of a semiconductor layer generating the light.

5. A semiconductor light emitting element as claimed in claim 4, wherein a structure in the part of the layer-stacked structure having the electrode for electric current injection in its upper portion is the same as that in said another part of the layer-stacked structure having no electrode for electric current injection in its upper portion between the electrode and the light emitting end face; and
   a height of the semiconductor substrate in the part of the layer-stacked structure having the electrode for electric current injection in its upper portion is different from a height of the semiconductor substrate in said another part of the layer-stacked structure having no electrode for electric current injection in its upper portion between the electrode and the light emitting end face so that a step difference is formed on the semiconductor substrate.

6. A semiconductor light emitting element as claimed in claim 1 or 2, wherein a width in said another part of the layer-stacked structure having no electrode for electric current injection in its upper portion between the electrode and the light emitting end face in a direction perpendicular to a light emitting direction is wider than a width in the part of the layer-stacked structure having the electrode for electric current injection in its upper portion in the direction perpendicular to the light emitting direction.

7. A semiconductor light emitting element as claimed in claim 1, wherein the light emitting end face has a hyperbolic shape in a direction parallel to the semiconductor substrate face; and the electrode for electric current injection formed in the upper portion of the layer-stacked structure is arranged in a position apart in a direction opposite to the light emitting end face from a plane including coupling portions between the hyperbolic shaped light emitting end face and each of two side faces of the layer-stacked structure opposed to each other.

8. A semiconductor light emitting element as claimed in claim 7, wherein the electrode for electric current injection is apart from the plane by at least 3 μm.

9. A semiconductor light emitting element as claimed in claim 7 or 8, wherein a groove is formed from the upper portion of the layer-stacked structure between the light emitting end face and the electrode for electric current injection until a depth which does not reach the light generating portion.

10. A semiconductor light emitting element as claimed in claim 7 or 8, wherein a height in a part of the layer-stacked structure having the electrode for electric current injection in its upper portion is different from a height in another part of the layer-stacked structure having no electrode for electric current injection in its upper portion between the electrode and the light emitting end face; and light generated within the part of the of the layer-stacked structure having the electrode for electric current injection can pass through a layer in said another part of the layer-stacked structure having no electrode for electric current injection and having a forbidden band width wider than that of a semiconductor layer generating the light.

11. A semiconductor light emitting element as claimed in claim 10, wherein a structure in the part of the layer-stacked structure having the electrode for electric current injection in its upper portion is the same as that in another part of the layer-stacked structure having no electrode for electric current injection in its upper portion between the electrode and the light emitting end face; and a height of the semiconductor substrate in the part of the layer-stacked structure having the electrode for electric current injection in its upper portion is different from a height of the semiconductor substrate in said another part of the layer-stacked structure having no electrode for electric current injection in its upper portion between the electrode and the light emitting end face so that a step difference is formed on the semiconductor substrate.

12. A semiconductor light emitting element as claimed in claim 7 or 8, wherein a width in said another part of the layer-stacked structure having no electrode for electric current injection in its upper portion between the electrode and the light emitting end face in a direction perpendicular to a light emitting direction is wider than a width in the part of the layer-stacked structure having the electrode for electric current injection in its upper portion in the direction perpendicular to the light emitting direction.

13. A semiconductor light emitting element comprising:

a layer-stacked structure of semiconductor layer formed on a semiconductor substrate and having a junction portion formed in parallel with a semiconductor substrate face;

the layer-stacked structure being constructed by a double hetero structure in which an active layer for generating light is supported between upper and lower clad layers each having forbidden band width wider than that of the active layer and having a refractive index smaller than that of the active layer;

the layer-stacked structure being constructed such that an electric current can be injected into the active layer;

a light emitting end face formed on a side face of the layer-stacked structure and approximately having an arc shape in a direction parallel to the semiconductor substrate face;

an electrode for electric current injection formed in an upper portion of the layer-stacked structure and arranged in a position apart from the arc shaped light emitting end face in the direction parallel to the semiconductor substrate face by a distance more than at least a radius of curvature of the arc shaped light emitting end face; and the semiconductor light emitting element being constructed such that the refractive index of each of the upper and lower clad layers supporting said active layer therebetween is reduced with a distance from the active layer in a thickness direction thereof.

14. A semiconductor light emitting element as claimed in claim 13, wherein the refractive index within each of the upper and lower clad layers supporting the active layer therebetween is continuously changed in a thickness direction thereof.

15. A semiconductor light emitting element as claimed in claim 13, wherein the refractive index within each of the upper and lower clad layers supporting the active layer therebetween is stepwisely changed in a thickness direction thereof.

16. A semiconductor light emitting element as claimed in claim 13, wherein a part of the layer-stacked structure having no electrode for electric current injection in its upper portion is formed between a part of the layer-stacked structure having the electrode for electric current injection in its upper portion and the light emitting end face.

17. A semiconductor light emitting element as claimed in claim 13, wherein a height in a part of the layer-stacked structure having the electrode for electric current injection in its upper portion is different from a height in an another part of the layer-stacked structure having no electrode for electric current injection in its upper portion between the electrode and the light-emitting end face; and light generated within the part of the layer-stacked structure having the electrode for electric current injection can pass through a layer in said another part of the layer-stacked structure having no electrode for electric current injection and having a forbidden band width wider than that of a semiconductor layer generating the light.

18. A semiconductor light emitting element as claimed in claim 17, wherein a structure in the part of the layer-stacked structure having the electrode for electric current injection in its upper portion is the same as that in said another part of the layer-stacked structure having no electrode for electric current injection in its upper portion between the electrode and the light emitting end face; and
- a height of the semiconductor substrate in the part of the layer-stacked structure having the electrode for electric current injection in its upper portion is different from a height of the semiconductor substrate in said another part of the layer-stacked structure having no electrode for electric current injection in its upper portion between the electrode and the light emitting end face so that step difference is formed on the semiconductor substrate.

19. A semiconductor light emitting element as claimed in claims 17 or 18, wherein a refractive index within one of the clad layers in said another part of the layer-stacked structure having no electrode for electric current injection in its upper portion between the electrode and the light emitting end face is set such that the refractive index is highest in a position having the same height with the active layer in the part of the layer-stacked structure having the electrode for electric current injection in its upper portion and is reduced in upper and lower directions from this position.

20. A semiconductor light emitting element as claimed in claim 1, wherein the semiconductor light emitting element comprises:
- a layer-stacked structure of semiconductor layers formed on a semiconductor substrate and having a junction portion formed in parallel with a semiconductor substrate face;
- the layer-stacked structure being constructed by a double hetero structure in which an active layer for generating light is supported between upper and lower clad layers each having a forbidden band width wider than that of the active layer and having a refractive index smaller than that of the active layer;
- the layer-stacked structure being constructed such that an electric current can be injected into the active layer;
- a light emitting end face formed on a side face of the layer-stacked structure;
- the semiconductor light emitting element being constructed such that the refractive index of each of the upper and lower clad layers supporting said active layer therebetween is reduced with a distance from the active layer in a thickness direction thereof; and
- layers above and below the light generating portion respectively correspond to the upper and lower clad layers.

21. A semiconductor light emitting element as claimed in claim 4, wherein the semiconductor light emitting element comprises:
- a layer-stacked structure of semiconductor layers formed on a semiconductor substrate and having a junction portion formed in parallel with a semiconductor substrate face;
- the layer-stacked structure being constructed by a double hetero structure in which an active layer for generating light is supported between upper and lower clad layers each having a forbidden band width wider than that of the active layer and having a refractive index smaller than that of the active layer;
- the layer-stacked structure being constructed such that an electric current can be injected into the active layer;
- a light emitting end face formed on a side face of the layer-stacked structure;
- the semiconductor light emitting element being constructed such that the refractive index of each of the upper and lower clad layers supporting said active layer therebetween is reduced with a distance from the active layer in a thickness direction thereof;
- a height in a part of the layer-stacked structure having the electrode for electric current injection in its upper portion is different from a height in another part of the layer-stacked structure having no electrode for electric current injection in its upper portion between the electrode and the light emitting end face;
- light generated within the part of the layer-stacked structure having the electrode for electric current injection can pass through a layer in said another part of the layer-stacked structure having no electrode for electric current injection and having a forbidden band width wider than that of a semiconductor layer generating the light; and
- layers above and below the light generating portion respectively correspond to the upper and lower clad layers.

22. A semiconductor light emitting element as claim in claim 7, wherein the semiconductor of light emitting element comprises:
- a layer-stacked structure of semiconductor layers formed on a semiconductor substrate and having a junction portion formed in parallel with a semiconductor substrate face;
- the layer-stacked structure being constructed by a double hetero structure in which an active layer for generating light is supported between upper and lower clad layers each having a forbidden band width wider than that of the active layer and having a refractive index smaller than that of the active layer;
- the layer-stacked structure being constructed such that an electric current can be injected into the active layer;
- a light emitting end face formed on a side face of the layer-stacked structure;
- the semiconductor light emitting element being constructed such that the refractive index of each of the upper and lower clad layers supporting said active layer therebetween is reduced with a distance from the active layer in a thickness direction thereof; and
- layers above and below the light generating portion respectively correspond to the upper and lower clad layers.

23. A semiconductor light emitting element as claimed in claim 10, wherein the semiconductor light emitting element comprises:
- a layer-stacked structure of semiconductor layers formed on a semiconductor substrate and having a junction portion formed in parallel with a semiconductor substrate face;

the layer-stacked structure being constructed by a double hetero structure in which an active layer for generating light is supported between upper and lower clad layers each having a forbidden band width wider than that of the active layer and having a refractive index smaller than that of the active layer;

the layer-stacked structure being constructed such that an electric current can be injected into the active layer;

a light emitting end face formed on a side face of the layer-stacked structure;

the semiconductor light emitting element being constructed such that the refractive index of each of the upper and lower clad layers supporting said active layer therebetween is reduced with a distance from the active layer in a thickness direction thereof; and layers above and below the light generating portion respectively correspond to the upper and lower clad layers.

24. A semiconductor light emitting element comprising:

A layer-stacked structure of semiconductor layers formed on a semiconductor substrate and having a junction portion formed in parallel with a semiconductor substrate face;

a light generating portion formed in the vicinity of the junction portion such that an electric current can be injected into the light generating portion;

a light emitting end face formed on a side face of the layer-stacked structure and approximately having an arc shape in a direction parallel to the semiconductor substrate face;

an electrode for electric current injection formed in an upper portion of the layer-stacked structure and arranged in a position apart from the arc shaped light emitting end face in the direction parallel to the semiconductor substrate face by a distance more than at least a radius of curvature of the arc shaped light emitting face; and wherein a groove is formed from the upper portion of the layer-stacked structure between the light emitting end face and the electrode for electric current injection until a depth which does not reach the light generating portion in the vicinity of the junction portion.

25. A semiconductor light emitting element comprising:

a layer-stacked structure of semiconductor layers formed on a semiconductor substrate and having a junction portion formed in parallel with a semiconductor substrate face;

a light generating portion formed in the vicinity of the junction portion such that an electric current can be injected into the light generating portion;

a light emitting end face formed on a side face of the layer-stacked structure and approximately having an arc shape in a direction parallel to the semiconductor substrate face;

an electrode for electric current injection formed in an upper portion of the layer-stacked structure and arranged in a position apart from the arc shaped light emitting end face in the direction parallel to the semiconductor substrate by a distance more than at least a radius of curvature of the arc shaped light emitting end face;

wherein a height in a part of the layer-stacked structure having the electrode for electric current injection in its upper portion is different from a height in another part of the layer-stacked structure having no electrode for electric current injection in its upper portion between the electrode and the light emitting end face; and light generated within the part of the layer-stacked structure having the electrode for electric current injection can pass through a layer in said another part of the layer-stacked structure having no electrode for electric current injection and having a forbidden band width wider than that of a semiconductor layer generating the light.

26. A semiconductor light emitting element as claimed in claim 24 or 25 wherein the electrode for electric current injection formed in the upper portion of the layer-stacked structure is arranged in a position apart from the arc shaped light emitting end face in the direction parallel to the semiconductor substrate face by a distance of at least 3 µm more than the radius of curvature of the arc shaped light emitting end face.

27. A semiconductor light emitting element as claimed in claim 25, wherein a structure in the part of the layer-stacked structure having the electrode for electric current injection in its upper portion is the same as that in said another part of the layer-stacked structure having no electrode for electric current injection in its upper portion between the electrode and the light emitting end face; and a height of the semiconductor substrate in the part of the layer-stacked structure having the electrode for electric current injection in its upper portion is different from a height of the semiconductor substrate in said another part of the layer-stacked structure having no electrode for electric current injection in its upper portion between the electrode and the light emitting end face so that a step difference is formed on the semiconductor substrate.

28. A semiconductor light emitting element comprising:

a layer-stacked structure of semiconductor layers formed on a semiconductor substrate and having a junction portion formed in parallel with a semiconductor substrate face;

a light generating portion formed in the vicinity of the junction portion such that an electric current can be injected into the light generating portion;

a light emitting end face formed on a side face of the layer-stacked structure and approximately having an hyperbolic shape in a direction parallel to the semiconductor substrate face;

an electrode for electric current injection formed in an upper portion of the layer-stacked structure and arranged in a position apart in a direction opposite to the light emitting end face from a plane including coupling portions between the hyperbolic shaped light emitting end face and each of two side faces of the layer-stacked structure opposed to each other; and wherein a groove is formed from the upper portion of the layer-stacked structure between the light emitting end face and the electrode for electric current injection until a depth which does not reach the light generating portion.

29. A semiconductor light emitting element comprising:

a layer-stacked structure of semiconductor layers formed on a semiconductor substrate and having a junction portion formed in parallel with a semiconductor substrate face;

a light generating portion formed in the vicinity of the junction portion such that an electric current can be injected into the light generating portion;

a light emitting end face formed on a side face of the layer-stacked structure and approximately having an hyperbolic shape in a direction parallel to the semiconductor substrate face;

an electrode for electric current injection formed in an upper portion of the layer-stacked structure and arranged in a position apart in a direction opposite to the light emitting end face from a plane including coupling portions between the hyperbolic shaped light emitting end face and each of two side faces of the layer-stacked structure opposed to each other;

wherein a height in a part of the layer-stacked structure having the electrode for electric current injection in its upper portion is different from a height in another part of the layer-stacked structure having no electrode for electrical current injection in its upper portion between the electrode and the light emitting end face; and light generated within the part of the layer-stacked structure having the electrode for electric current injection can pass through a layer in said another part of the layer-stacked structure having no electrode for electric current injection and having a forbidden band width wider than that of a semiconductor layer generating the light.

30. A semiconductor light emitting element as claimed in claim 28 or 29, wherein the electrode for electric current injection is apart from the plane by at least 3 μm.

31. A semiconductor light emitting element as claimed in claim 29, wherein a structure in the part of the layer-stacked structure having the electrode for electric current injection in its upper portion is the same as that in said another part of the layer-stacked structure having no electrode for electric current injection in its upper portion between the electrode and the light emitting end face; and a height of the semiconductor substrate in the part of the layer-substrate structure having the electrode for electric current injection in its upper portion is different from a height of the semiconductor substrate in said another part of the layer-stacked structure having no electrode for electric current injection in its upper portion between the electrode and the light emitting end face so that a step difference is formed on the semiconductor device.

32. A semiconductor light emitting element comprising:

a layer-stacked structure of semiconductor layers formed on a semiconductor substrate and having a junction portion formed in parallel with a semiconductor substrate face;

the layer-stacked structure being constructed by a double hetero structure in which an active layer for generating light is supported between upper and lower clad layers each having a forbidden band width wider than that of the active layer and having a refractive index smaller than that of the active layer;

the layer-stacked structure being constructed such that an electric current can be injected into the active layer;

a light emitting end face formed on a side face of the layer-stacked structure and approximately having an arc shape in a direction parallel to the semiconductor substrate face;

an electrode for electric current injection formed in an upper portion of the layer-stacked structure and arranged in a position apart from the arc shaped light emitting end face in the direction parallel to the semiconductor substrate face by a distance more than at least a radius of curvature of the arc shaped light emitting end face;

the semiconductor light emitting element being constructed such that the refractive index of each of the upper and lower clad layers supporting said active layer therebetween is reduced with a distance from the active layer in a thickness direction thereof;

wherein a height in a part of the layer-stacked structure having the electrode for electric current injection in its upper portion is different from a height in another part of the layer-stacked structure having no electrode for electric current injection in its upper portion between the electrode and the light emitting end face; and light generated within the part of the layer-stacked structure having the electrode for electric current injection can pass through a layer in said another part of the layer-stacked structure having no electrode for electric current injection and having a forbidden band width wider than that of a semiconductor layer generating the light.

33. A semiconductor light emitting element as claimed in claim 32, wherein a structure in the part of the layer-stacked structure having the electrode for electric current injection in its upper portion is the same as that in said another part of the layer-stacked structure having no electrode for electric current injection in its upper portion between the electrode and the light emitting end face; and a height of the semiconductor substrate in the part of the layer-stacked structure having the electrode for electric current injection in its upper portion is different from a height of the semiconductor substrate in said another part of the layer-stacked structure having no electrode for electric current injection in its upper portion between the electrode and the light emitting end face so that a step difference is formed on the semiconductor substrate.

34. A semiconductor light emitting element as claimed in claim 32 or 33, wherein a refractive index within one of the clad layers in said another part of the layer-stacked structure having no electrode for electric current injection in its upper portion between the electrode and the light emitting end face is set such that the refractive index is highest in a position having the same height with the active layer in the part of the layer-stacked structure having the electrode for electric current injection in its upper portion and is reduced in upper and lower directions from this position.

35. A semiconductor light emitting element comprising:

a layer-stacked structure of semiconductor layers formed on a semiconductor substrate and having a junction portion formed in parallel with a semiconductor substrate face;

a light generating portion formed in the vicinity of the junction portion such that an electric current can be injected into the light generating portion;

a light emitting end face formed on a side face of the layer-stacked structure and approximately having an arc shape in a direction parallel to the semiconductor substrate face;

an electrode for electric current injection formed in an upper portion of the layer-stacked structure and arranged in a position apart from the arc shaped light emitting end face in the direction parallel to the semiconductor substrate face by a distance more than at least a radius of curvature of the arc shaped light emitting end face;

wherein the layer-stacked structure being constructed by a double hetero structure in which an active layer for generating light is supported between upper and lower clad layers each having a forbidden band width wider than that of the active layer and having a refractive index smaller than that of the active layer;

the layer-stacked structure being constructed such that an electric current can be injected into the active layer;

the semiconductor light emitting element being constructed such that the refractive index of each of the upper and lower clad layers supporting said active layer therebetween is reduced with a distance from the active layer in a thickness direction thereof;

a height in a part of the layer-stacked structure having the electrode for electric current injection in its upper portion is different from a height in another part of the layer-stacked structure having no electrode for electric current injection in its upper portion between the electrode and the light emitting end face;

light generated within the part of the layer-stacked structure having the electrode for electric current injection can pass through a layer in said another part of the layer-stacked structure having no electrode for electric current injection and having a forbidden band width wider than that of a semiconductor layer generating the light; and layers above and below the light generating portion respectively correspond to the upper and lower clad layers.

36. A semiconductor light emitting element comprising:

a layer-stacked structure of semiconductor layers formed on semiconductor substrate and having a junction portion formed in parallel with a semiconductor substrate face;

a light generating portion formed in the vicinity of the junction portion such that an electric current can be injected into the light generating portion;

a light emitting end face formed on a side face of the layer-stacked structure and approximately having an hyperbolic shape in a direction parallel to the semiconductor substrate face;

an electrode for electric current injection formed in an upper portion of the layer-stacked structure and arranged in a position apart in a direction opposite to the light emitting end face from a plane including coupling portion between the hyperbolic shaped light emitting end face and each of two side faces of the layer-stacked structure as opposed to each other;

wherein a height in a part of the layer-stacked structure having the electrode for electric current injection in its upper portion is different from a height in another part of the layer-stacked structure having no electrode for electric current injection in its upper portion between the electrode and the light emitting end face;

the layer-stacked structure being constructed by a double hetero structure in which an active layer for generating light is supported between upper and lower clad layers each having a forbidden band width wider than that of the active layer and having a refractive index smaller than that of the active layer;

the layer-stacked structure being constructed such that an electric current can be injected into the active layer;

the semiconductor light emitting element being constructed such that the refractive index of each of the upper and lower clad layers supporting said active layer therebetween is reduced with a distance from the active layer in a thickness direction thereof; and layers above and below the light generating portion respectively correspond to the upper and lower clad layers.

37. A semiconductor light emitting element as claimed in claim 36, wherein the electrode for electric current injection is apart from the plane by at least 3 $\mu$m.

* * * * *